United States Patent
Jiao et al.

(10) Patent No.: US 12,183,425 B2
(45) Date of Patent: Dec. 31, 2024

(54) DATA READING/WRITING METHOD, MEMORY, STORAGE APPARATUS, AND TERMINAL

(71) Applicant: HUAWEI TECHNOLOGIES CO., LTD., Guangdong (CN)

(72) Inventors: Huifang Jiao, Shenzhen (CN); Ran He, Yokohama (JP); Luming Fan, Shenzhen (CN); Yue Pan, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 155 days.

(21) Appl. No.: 17/893,067

(22) Filed: Aug. 22, 2022

(65) Prior Publication Data

US 2022/0406348 A1  Dec. 22, 2022

Related U.S. Application Data

(63) Continuation of application No. PCT/CN2020/076279, filed on Feb. 21, 2020.

(51) Int. Cl.
  *G11C 7/12* (2006.01)
  *G11C 7/06* (2006.01)
  (Continued)

(52) U.S. Cl.
  CPC .............. *G11C 7/12* (2013.01); *G11C 7/067* (2013.01); *G11C 7/1012* (2013.01); *G11C 8/08* (2013.01)

(58) Field of Classification Search
  CPC ...................................................... G11C 7/12
  See application file for complete search history.

(56) References Cited

U.S. PATENT DOCUMENTS

2001/0030893 A1* 10/2001 Terzioglu .............. G11C 7/06
                                                         365/200
2002/0031007 A1  3/2002 Osada et al.
(Continued)

FOREIGN PATENT DOCUMENTS

CN  1516195 A  7/2004
CN  1591689 A  3/2005
(Continued)

OTHER PUBLICATIONS

Matthew Poremba et al: "Fine-granularity tile-level parallelism in non-volatile memory architecture with two dimensional bank sub-division", Proceedings of the 53rd Annual Design Automation Conference on, DAC"16, ACM Press, New York, New York, USA, Jun. 5, 2016 (Jun. 5, 2016), pp. 1-6, XP058259033.

*Primary Examiner* — Douglas King

(57) ABSTRACT

A memory includes S storage blocks, N global bitlines, and a signal amplification circuit. Each of the S storage blocks is connected to the N global bitlines, the N global bitlines are connected to the signal amplification circuit, the signal amplification circuit is configured to amplify electrical signals on the N global bitlines, and each storage block includes N columns of storage units, N local bitlines, and N bitline switches. In each storage block, storage units in an $i^{th}$ column are connected to an $i^{th}$ local bitline, the $i^{th}$ local bitline is connected to an $i^{th}$ global bitline by using an $i^{th}$ bitline switch in the N bitline switches. A memory array is fine-grained, so that $i^{th}$ local bitlines in the S storage blocks can share one global bitline.

19 Claims, 14 Drawing Sheets

(51) Int. Cl.
*G11C 7/10* (2006.01)
*G11C 8/08* (2006.01)

(56) References Cited

U.S. PATENT DOCUMENTS

| | | | |
|---|---|---|---|
| 2005/0185483 A1* | 8/2005 | Sugiura | G11C 29/82 |
| | | | 365/200 |
| 2005/0281080 A1* | 12/2005 | Dray | G11C 7/12 |
| | | | 365/171 |
| 2006/0114711 A1* | 6/2006 | Khellah | G11C 11/419 |
| | | | 365/154 |
| 2010/0271862 A1* | 10/2010 | Yoon | G11C 8/12 |
| | | | 365/158 |
| 2014/0192596 A1* | 7/2014 | Rhie | G11C 16/0483 |
| | | | 365/185.05 |
| 2018/0151200 A1* | 5/2018 | Miyazaki | H10B 63/34 |
| 2019/0361820 A1 | 11/2019 | Ware | |

FOREIGN PATENT DOCUMENTS

| | | |
|---|---|---|
| CN | 101221540 A | 7/2008 |
| CN | 107799141 A | 3/2018 |
| EP | 0924709 A2 | 6/1999 |
| WO | 2016209542 A1 | 12/2016 |

\* cited by examiner

DATA READING/WRITING METHOD, MEMORY, STORAGE APPARATUS, AND TERMINAL

CROSS-REFERENCE TO RELATED APPLICATIONS

This application is a continuation of International Application No. PCT/CN2020/076279, filed on Feb. 21, 2020, the disclosure of which is hereby incorporated by reference in its entirety.

TECHNICAL FIELD

The present application relates to the field of storage technologies, and in particular, to a data reading/writing method, a memory, a storage apparatus, and a terminal.

BACKGROUND

With development of computer technologies, a bottleneck of improving a running speed of a computer system lies in a memory, and a delay of the memory is mainly caused by a row cycle time (tRC) delay. A large memory array (usually including 512 rows×1024 columns of storage units) is a main cause of a high tRC delay. In a large memory array, each time when a transistor on a wordline is enabled and long-distance data transmission is performed on a bitline, a delay of the memory occurs.

Currently, how to reduce a delay of a memory is a technical problem that urgently needs to be resolved to improve computer performance.

SUMMARY

Embodiments of the present application provide a data reading/writing method, a memory, a storage apparatus, and a terminal, to resolve a technical problem of a high delay of a memory in a current computer system.

According to a first aspect, an embodiment of this application provides a memory, including S storage blocks, N global bitlines, and a signal amplification circuit. Each of the S storage blocks is connected to the N global bitlines, the N global bitlines are connected to the signal amplification circuit, the signal amplification circuit is configured to amplify electrical signals on the N global bitlines, S and N are positive integers, S≥2, and each storage block includes N columns of storage units, N local bitlines, and N bitline switches.

In each storage block, storage units in an $i^{th}$ column in the N columns of storage units are connected to an $i^{th}$ local bitline in the N local bitlines, the $i^{th}$ local bitline is connected to an $i^{th}$ global bitline in the N global bitlines by using an $i^{th}$ bitline switch in the N bitline switches, N is a positive integer, and i is a positive integer not greater than N.

In the memory, the $i^{th}$ local bitline in each storage block is connected to the same global bitline, namely, the $i^{th}$ global bitline by using one bitline switch. In this case, the $i^{th}$ local bitline and the $i^{th}$ global bitline in each storage block may be controlled to be turned on or off by controlling the $i^{th}$ bitline switch in each storage block to be turned on or off. Therefore, $i^{th}$ local bitlines in the S storage blocks can share one global bitline, and the S storage blocks can share one signal amplification circuit and a bitline drive circuit, to reduce a quantity of signal amplification circuits and a quantity of bitline drive circuits in the memory, and reduce preparation costs of the memory. In addition, a memory array is fine-grained. This can shorten the local bitline, reduce parasitic capacitance caused by the local bitline, and reduce a delay of a read/write operation.

In a possible implementation, the signal amplification circuit includes N differential amplifiers, and an $i^{th}$ differential amplifier in the N differential amplifiers is configured to amplify an electrical signal on the $i^{th}$ global bitline.

The memory can simultaneously read data in storage units in different columns, to increase a read operation speed of the memory.

In a possible implementation, the signal amplification circuit includes P multiplexers and P differential amplifiers, an input end of a $k^{th}$ multiplexer in the P multiplexers is connected to at least two of the N global bitlines, an output end of the $k^{th}$ multiplexer in the P multiplexers is connected to a $k^{th}$ differential amplifier in the P differential amplifiers, the $k^{th}$ multiplexer in the P multiplexers is configured to select, for outputting, one electrical signal from electrical signals transmitted on the at least two global bitlines, P is a positive integer not greater than N, and k is a positive integer not greater than P.

In the memory using the signal amplification circuit, data in a plurality of storage units indirectly connected to different multiplexers may be simultaneously read. This can increase a read operation speed and reduce costs.

In a possible implementation, each storage block further includes N first control lines separately connected to control ends of the N bitline switches, the N first control lines are all connected to a first control circuit, and the first control circuit is configured to control the N bitline switches to be turned on.

In a possible implementation, the memory further includes a bitline drive circuit, and the bitline drive circuit is connected to the N global bitlines, and is configured to input electrical signals to the N global bitlines.

In a possible implementation, storage units in each storage block are arranged in M rows×N columns, each storage block further includes M wordlines, storage units in a $j^{th}$ row in the M rows×N columns of storage units are connected to a $j^{th}$ wordline in the M wordlines, M is a positive integer, and j is a positive integer not greater than M.

Optionally, the memory further includes a wordline drive circuit, and the wordline drive circuit is connected to wordlines in the S storage blocks, and is configured to control a potential of the wordline.

In a possible implementation, each storage block is divided into T storage sub-blocks, the storage sub-blocks in the memory are arranged in S rows×T columns, each column of storage sub-blocks forms one storage domain, the memory includes T storage domains, the memory further includes W global wordlines, T and W are positive integers, T≥2, and each of the T storage domains includes W rows of storage units, W local wordlines, and W wordline switches.

In each storage domain, storage units in a $v^{th}$ row in the W rows of storage units are connected to a $v^{th}$ local wordline in the W local wordlines, the $v^{th}$ local wordline is connected to a $v^{th}$ local wordline in the W global wordlines by using a $v^{th}$ wordline switch in the W wordline switches, W is a positive integer, and v is a positive integer not greater than W.

In the memory, the memory array is fine-grained. This can shorten both the local bitline and the local wordline, further reduce an operation delay of the memory, and improve performance of the memory.

Optionally, each storage domain further includes W second control lines separately connected to the W wordline switches, the W second control lines are all connected to a second control circuit, and the second control circuit is configured to control the W wordline switches to be turned on.

Optionally, the memory further includes a wordline drive circuit, and the wordline drive circuit is connected to global wordlines in the T storage domains, and is configured to control a potential of the global wordline.

According to a second aspect, an embodiment of this application further provides a storage apparatus, including the memory in the first aspect and a storage controller. The memory is coupled to the storage controller.

For specific implementations of the memory, refer to related descriptions in the first aspect. Details are not described herein again.

According to a third aspect, an embodiment of this application further provides a terminal, including a processor and the memory in the first aspect. The memory is coupled to the processor.

For specific implementations of the memory, refer to related descriptions in the first aspect. Details are not described herein again.

According to a fourth aspect, an embodiment of this application further provides a data reading method, applied to a memory. The memory includes S storage blocks, N global bitlines, and a signal amplification circuit, each of the S storage blocks is connected to the N global bitlines, the N global bitlines are connected to the signal amplification circuit, the signal amplification circuit is configured to amplify electrical signals on the N global bitlines, S and N are positive integers, S≥2, and each storage block includes N columns of storage units, N local bitlines, and N bitline switches. In each storage block, storage units in an $i^{th}$ column in the N columns of storage units are connected to an $i^{th}$ local bitline in the N local bitlines, the $i^{th}$ local bitline is connected to an $i^{th}$ global bitline in the N global bitlines by using an $i^{th}$ bitline switch in the N bitline switches, N is a positive integer, and i is a positive integer not greater than N. The method includes:

selecting a target storage unit in a target storage block, where the target storage unit is connected to a $y^{th}$ local bitline in the target storage block, and y is a positive integer not greater than N;

turning on a $y^{th}$ bitline switch in the target storage block, to transmit an electrical signal in the target storage unit to a $y^{th}$ global bitline in the N global bitlines by using the $y^{th}$ local bitline; and amplifying, by using the signal amplification circuit, the electrical signal on the $y^{th}$ global bitline.

In a possible implementation, the signal amplification circuit includes N differential amplifiers, an $i^{th}$ differential amplifier in the N differential amplifiers is connected to the $i^{th}$ global bitline, and the amplifying, by using the signal amplification circuit, the electrical signal on the $y^{th}$ global bitline specifically includes:

amplifying, by using a target differential amplifier, the electrical signal on the $y^{th}$ global bitline, where the target differential amplifier is a differential amplifier, in the N differential amplifiers, that is connected to the $y^{th}$ global bitline.

In a possible implementation, the signal amplification circuit includes P multiplexers and P differential amplifiers, an input end of a $k^{th}$ multiplexer in the P multiplexers is connected to at least two of the N global bitlines, an output end of the $k^{th}$ multiplexer in the P multiplexers is connected to a $k^{th}$ differential amplifier in the P differential amplifiers, the $k^{th}$ multiplexer in the P multiplexers is configured to select, for outputting, one electrical signal from electrical signals transmitted on the at least two global bitlines, P is a positive integer not greater than N, k is a positive integer not greater than P, and the amplifying, by using the signal amplification circuit, the electrical signal on the $y^{th}$ global bitline specifically includes:

inputting, by using a target multiplexer connected to the $y^{th}$ global bitline, the electrical signal on the $y^{th}$ global bitline to a target differential amplifier connected to the target multiplexer; and amplifying, by using the target differential amplifier, the electrical signal on the $y^{th}$ global bitline.

In a possible implementation, each storage block further includes N first control lines separately connected to control ends of the N bitline switches, and the turning on a $y^{th}$ bitline switch in the target storage block includes:

inputting, to a first control line connected to the $y^{th}$ bitline switch, a control signal used to turn on the $y^{th}$ bitline switch.

In a possible implementation, storage units in each storage block are arranged in M rows×N columns, each storage block further includes M wordlines, storage units in a $j^{th}$ row in the M rows×N columns of storage units are connected to a $j^{th}$ wordline in the M wordlines, M is a positive integer, j is a positive integer not greater than M, the target storage unit is connected to an $x1^{th}$ wordline in the target storage block, x1 is a positive integer not greater than M, and the selecting a target storage unit in a target storage block includes:

inputting, to the $x1^{th}$ wordline, a control signal used to select the target storage unit.

In possible implementation, each storage block is divided into T storage sub-blocks, the storage sub-blocks in the memory are arranged in S rows×T columns, each column of storage sub-blocks forms one storage domain, the memory includes T storage domains, the memory further includes W global wordlines, T and W are positive integers, T≥2, and the storage domain includes W rows of storage units, W local wordlines, and W wordline switches. Storage units in a $v^{th}$ row in the W rows of storage units are connected to a $v^{th}$ local wordline in the W local wordlines, the with local wordline is connected to a $v^{th}$ local wordline in the W global wordlines by using a with wordline switch in the W wordline switches, W is a positive integer, v is a positive integer not greater than W, the target storage unit is connected to an $x2^{th}$ local wordline in a target storage domain, x2 is a positive integer not greater than W, and the selecting a target storage unit in a target storage block includes:

turning on an $x2^{th}$ wordline switch in the target storage domain, to turn on the $x2^{th}$ local wordline and an $x2^{th}$ global wordline in the W global wordlines; and inputting, to the $x2^{th}$ global wordline in the W global wordlines, a control signal used to select the target storage unit.

Optionally, the storage domain further includes W second control lines separately connected to the W wordline switches, and the turning on an $x2^{th}$ wordline switch in the target storage domain includes:

inputting, to a second control line connected to the $x2^{th}$ wordline switch, a control signal used to turn on the $x2^{th}$ wordline switch.

According to a fifth aspect, an embodiment of this application further provides a data writing method, applied to a memory. The memory includes S storage blocks, N global bitlines, and a signal amplification circuit, each of the S storage blocks is connected to the N global bitlines, the N global bitlines are connected to the signal amplification circuit, the signal amplification circuit is configured to amplify electrical signals on the N global bitlines, S and N are positive integers, S≥2, and each storage block includes N columns of storage units, N local bitlines, and N bitline switches. In each storage block, storage units in an $i^{th}$ column in the N columns of storage units are connected to an $i^{th}$ local bitline in the N local bitlines, the $i^{th}$ local bitline is connected to an $i^{th}$ global bitline in the N global bitlines by using an $i^{th}$ bitline switch in the N bitline switches, N is a positive integer, and i is a positive integer not greater than N. The method includes:

selecting a target storage unit in a target storage block, where the target storage unit is connected to a $y^{th}$ local bitline in the target storage block, and y is a positive integer not greater than N;

turning on a $y^{th}$ bitline switch in the target storage block, to turn on the $y^{th}$ local bitline and a $y^{th}$ global bitline in the N global bitlines; and inputting a target electrical signal to the $y^{th}$ global bitline, to store the target electrical signal in the target storage unit.

In a possible implementation, each storage block further includes N first control lines separately connected to control ends of the N bitline switches, and the turning on a $y^{th}$ bitline switch in the target storage block includes:

inputting, to a first control line connected to the $y^{th}$ bitline switch, a control signal used to turn on the $y^{th}$ bitline switch.

In a possible implementation, storage units in each storage block are arranged in M rows×N columns, each storage block further includes M wordlines, storage units in a $j^{th}$ row in the M rows×N columns of storage units are connected to a $j^{th}$ wordline in the M wordlines, M is a positive integer, j is a positive integer not greater than M, the target storage unit is connected to an $x1^{th}$ wordline in the target storage block, x1 is a positive integer not greater than M, and the selecting a target storage unit in a target storage block includes:

inputting, to the $x1^{th}$ wordline, a control signal used to select the target storage unit.

In possible implementation, each storage block is divided into T storage sub-blocks, the storage sub-blocks in the memory are arranged in S rows×T columns, each column of storage sub-blocks forms one storage domain, the memory includes T storage domains, the memory further includes W global wordlines, T and W are positive integers, T≥2, and the storage domain includes W rows of storage units, W local wordlines, and W wordline switches. Storage units in a $v^{th}$ row in the W rows of storage units are connected to a $v^{th}$ local wordline in the W local wordlines, the with local wordline is connected to a $v^{th}$ local wordline in the W global wordlines by using a with wordline switch in the W wordline switches, W is a positive integer, v is a positive integer not greater than W, the target storage unit is connected to an $x2^{th}$ wordline in a target storage domain, x2 is a positive integer not greater than W, and the selecting a target storage unit in a target storage block includes:

turning on an $x2^{th}$ wordline switch in the target storage domain, to turn on the $x2^{th}$ local wordline and an $x2^{th}$ global wordline in the W global wordlines; and inputting, to the $x2^{th}$ global wordline in the W global wordlines, a control signal used to select the target storage unit.

Optionally, the storage domain further includes W second control lines separately connected to the W wordline switches, and the turning on an $x2^{th}$ wordline switch in the target storage domain includes:

inputting, to a second control line connected to the $x2^{th}$ wordline switch, a control signal used to turn on the $x2^{th}$ wordline switch.

According to a sixth aspect, an embodiment of this application further provides a storage controller, applied to the memory in the first aspect, and configured to implement the data reading method in the fourth aspect.

According to a seventh aspect, an embodiment of this application further provides a storage controller, applied to the memory in the first aspect, and configured to implement the data writing method in the fifth aspect.

According to an eighth aspect, an embodiment of this application further provides a chip, including the memory in the first aspect.

BRIEF DESCRIPTION OF DRAWINGS

To describe technical solutions in embodiments of the present application or in the background more clearly, the following briefly describes the accompanying drawings for describing embodiments of the present application or the background.

DESCRIPTION OF EMBODIMENTS

A memory shown in embodiments of this application may be a random access memory (RAM), a dynamic random access memory (DRAM), a static random access memory (SRAM), a synchronous dynamic random access memory (SDRAM), a double data rate synchronous dynamic random access memory (DDR SDRAM), a high bandwidth memory (HBM), a read-only memory (ROM), a cache, a flash memory, a hard disk drive (HDD), a solid-state disk (SSD), or the like.

Figure 1:
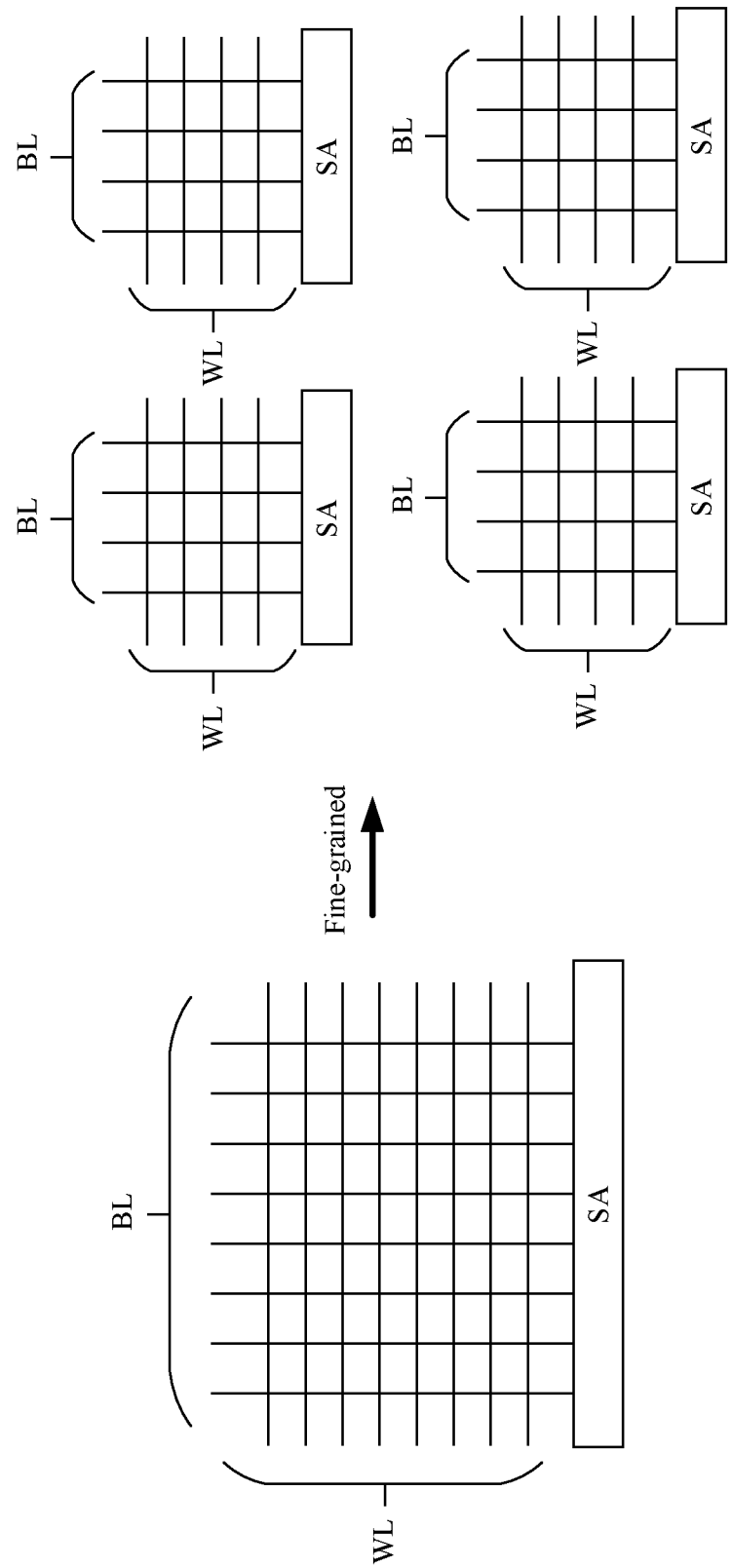
FIG. 1 is a schematic diagram of a circuit of a memory according to the conventional technology.

An architecture of a memory array may be fine-grained, to reduce a delay of the memory. FIG. 1 is a schematic diagram of a structure of a memory according to an embodiment of this application. In the memory, an original memory array is divided into a plurality of small memory arrays, and a logic circuit, for example, a bitline sense amplifier (BLSA) or a differential amplifier, is configured for each small memory array. After the memory array is fine-grained, a bitline becomes shorter, parasitic capacitance caused by the bitline is further reduced, and a delay of the memory is reduced.

However, although a capacity of each memory array is reduced through fine graining, more areas need to be occupied to configure logic circuits. Consequently, a storage capacity in a same chip area is reduced, and costs per bit are greatly increased.

To reduce a delay and costs of the memory, this application provides a memory. A memory array in the memory is fine-grained, to shorten a length of a bitline in the memory array, and reduce parasitic capacitance. In addition, a bitline (which is also referred to as a local bitline) in each memory array is connected to a global bitline by using a switch, so that bitlines in memory arrays can share a global bitline, a signal amplification signal, a bitline drive circuit, and the like. This can reduce drive time of a circuit, and reduce costs of the memory.

Key terms related to this application are first described.
(1) Memory Array

The memory array is a memory array including storage units. In the memory array, each row of storage units is connected to a wordline, and each column of storage units is connected to a bitline.

(2) Storage Domain and Storage Block

In this application, the storage block or the storage domain may be a memory array, or may be a plurality of memory arrays arranged in a bitline direction or a wordline direction.

(3) Local Bitline (LBL), Global Bitline (GBL), and Bitline Switch

Bitlines are divided into a local bitline and a global bitline based on different locations of the bitlines. A bitline located only in a memory array or connected only to a storage unit in the memory array is referred to as a local bitline. A bitline located in a plurality of memory arrays or connected to storage units in the plurality of memory arrays is referred to as a global bitline.

It should be understood that in this application, the global bitline is not directly connected to the storage unit, but is connected to the local bitline by using a switch. The switch is referred to as a bitline switch in this application. In other words, the bitline switch is a switch used to connect the local bitline and the global bitline.

(4) Local Wordline (LWL), Global Wordline (GWL), and Wordline Switch

Wordlines are divided into a local wordline and a global wordline based on different locations of the wordlines. A wordline located only in a memory array or connected only to a storage unit in the memory array is referred to as a local wordline. A wordline located in a plurality of memory arrays or connected to storage units in the plurality of memory arrays is referred to as a global wordline.

It should be understood that in this application, the global wordline is not directly connected to the storage unit, but is connected to the local wordline by using a switch. The switch is referred to as a wordline switch in this application. In other words, the wordline switch is a switch used to connect the local wordline and the global wordline.

The following describes the memory provided in this application with reference to the accompanying drawings.

Figure 2A:
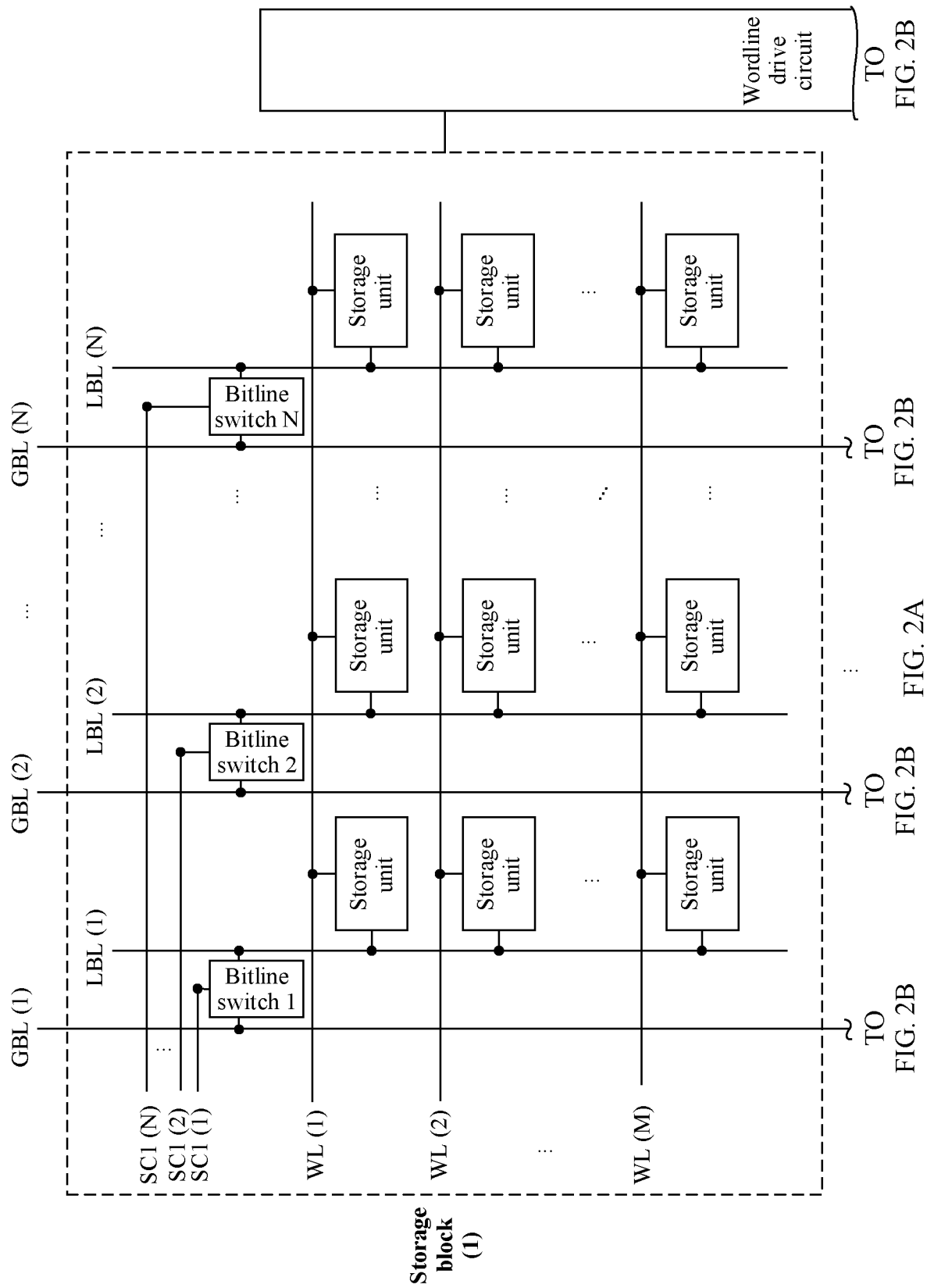
FIG. 2A and FIG. 2B are a schematic diagram of a circuit of a memory according to an embodiment of this application.
Figure 2B:
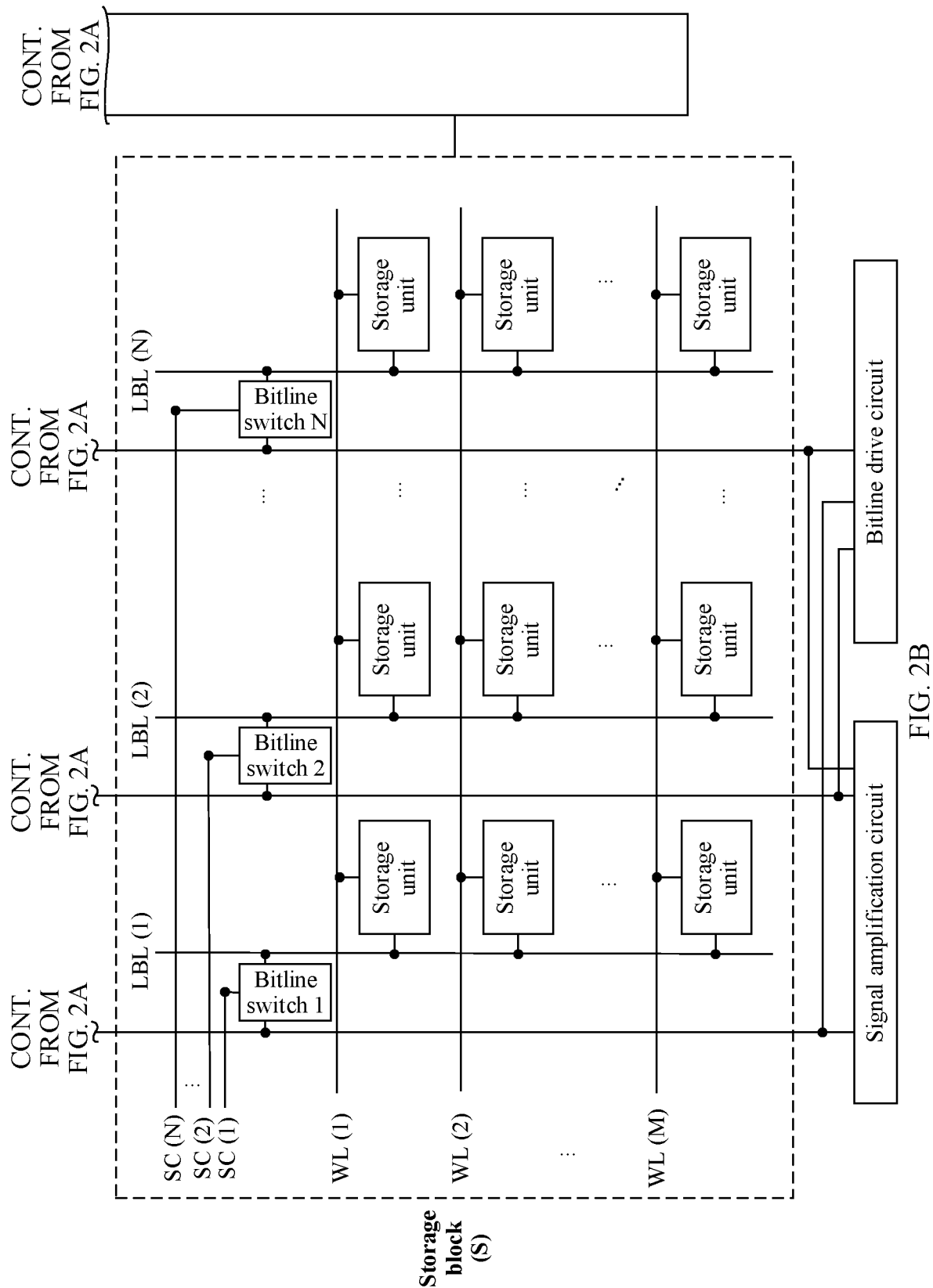

FIG. 2A and FIG. 2B are a schematic diagram of a circuit of a memory according to an embodiment of this application. The memory may include S storage blocks, N global bitlines, a signal amplification circuit, a bitline drive circuit, a wordline drive circuit, and the like. Each of the S storage blocks is connected to the N global bitlines, the N global bitlines are connected to the signal amplification circuit and the bitline drive circuit, the signal amplification circuit is configured to amplify electrical signals on the N global bitlines, S and N are positive integers, and S≥2. The bitline drive circuit is configured to: when a write operation is performed on a storage unit in the memory, select a global bitline corresponding to the storage unit, to input an electrical signal to the global bitline. The wordline drive circuit is configured to: when an operation (a read operation or a write operation) is performed on a storage unit in the memory, input an electrical signal to a wordline corresponding to the storage unit.

It should be noted that although FIG. 2A and FIG. 2B show the bitline drive circuit, the wordline drive circuit, and the like, the signal amplification circuit, the bitline drive circuit, and the wordline drive circuit are not mandatory circuits of the memory in this application.

In some embodiments, the memory may further include the bitline drive circuit, and the bitline drive circuit is connected to the N global bitlines, and is configured to input electrical signals to the N global bitlines. It should be understood that the bitline drive circuit is functioning when the memory performs a write operation.

For example, when data needs to be written into a storage unit, an electrical signal corresponding to the written data is input, by using the bitline drive circuit, to a global bitline that is electrically connected to the storage unit. The storage unit has two states: "0" and "1". For example, when the storage unit needs to be set to the "1" state, the bitline drive circuit inputs a high potential to the global bitline connected to the storage unit. On the contrary, when the storage unit needs to be set to the "0" state, the bitline drive circuit inputs a low potential to the global bitline connected to the storage unit.

Each of the S storage blocks includes N columns of storage units, N local bitlines, and N bitline switches. In each storage block, storage units in an $i^{th}$ column in the N columns of storage units are connected to an $j^{th}$ local bitline in the N local bitlines, the $j^{th}$ local bitline is connected to an $j^{th}$ global bitline in the N global bitlines by using an $j^{th}$ bitline switch in the N bitline switches, N is a positive integer, and i is a positive integer not greater than N. A value of i may be 1, 2, . . . , or N.

In the memory shown in FIG. 2A and FIG. 2B, the S storage blocks are represented as a storage block (1), a storage block (2), . . . , and a storage block (S). The N global bitlines are represented as a GBL (1), a GBL (2), . . . , and a GBL (N), and a GBL (i) indicates the $j^{th}$ global bitline in the N global bitlines. In each storage block, the N local bitlines are represented as an LBL (1), an LBL (2), . . . , and an LBL (N), the N bitline switches are represented as a bitline switch 1, a bitline switch 2, . . . , and a bitline switch N, an LBL (i) indicates an $j^{th}$ local bitline in a storage block, and a bitline switch i indicates an $j^{th}$ bitline switch in a storage block. It should be understood that although the N local bitlines and the N bitline switches in the storage blocks are represented in the same manner, LBLs (i) in any two different storage blocks in the S storage blocks are actually two different local bitlines. Similarly, bitline switches i in any two different storage blocks are actually two different bitline switches.

In an embodiment of this application, each storage block is a storage unit array including N columns of storage units, the S storage blocks are arranged in a bitline direction to form a storage block array, and the storage block array also includes N columns of storage units. In this case, storage units in an $j^{th}$ column in each storage block are still in an $j^{th}$ column in the storage block array including the S storage blocks. For one storage block, each of storage units in an $j^{th}$ column is connected to an $i^{th}$ local bitline, and the $j^{th}$ local bitline is connected to an $j^{th}$ global bitline by using an $i^{th}$ bitline switch.

It can be learned that the $i^{th}$ local bitline in each storage block is connected to the same global bitline, namely, the $i^{th}$ global bitline by using one bitline switch. In this case, the $i^{th}$ local bitline and the $i^{th}$ global bitline in each storage block may be controlled to be turned on or off by controlling the $i^{th}$ bitline switch in each storage block to be turned on or off. Therefore, $i^{th}$ local bitlines in the S storage blocks can share one global bitline, and the S storage blocks can share one signal amplification circuit and a bitline drive circuit, to reduce a quantity of signal amplification circuits and a quantity of bitline drive circuits in the memory, and reduce preparation costs of the memory. In addition, a memory array is fine-grained. This can shorten the local bitline, reduce parasitic capacitance caused by the local bitline, and reduce a delay of a read/write operation.

Figure 3:
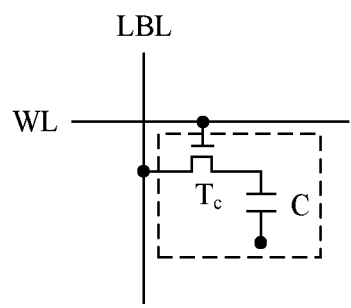
FIG. 3 is a schematic diagram of a circuit of a storage unit according to an embodiment of this application.

In some embodiments, the storage unit may be a 1T1C (one-transistor one-capacitor) storage unit, namely, including one transistor and one capacitor. FIG. 3 is a schematic diagram of a circuit of a storage unit according to an embodiment of this application. One storage unit includes a transistor $T_c$ and a capacitor C in a dashed line box in FIG. 3, and the storage unit controls, by using the transistor $T_c$, the capacitor C to perform charging/discharging. For example, for a storage unit, a gate of a transistor $T_c$ is connected to a wordline, and a source and a drain of the transistor are respectively connected to a local bitline and a capacitor C. Herein, that the transistor $T_c$ is a field effect transistor is used as an example for description. It should be understood that the transistor $T_c$ may alternatively be another type of transistor, for example, a triode. This is not limited herein. It should further be understood that the storage unit may alternatively be a storage unit of another structure. For example, the memory is an SRAM, and the storage unit includes a transistor and a latch. This is not limited herein.

In some embodiments, the bitline switch may include a switch that includes at least one transistor and that has functions of turning on and turning off. For example, the bitline switch is a transistor.

Figure 4A:
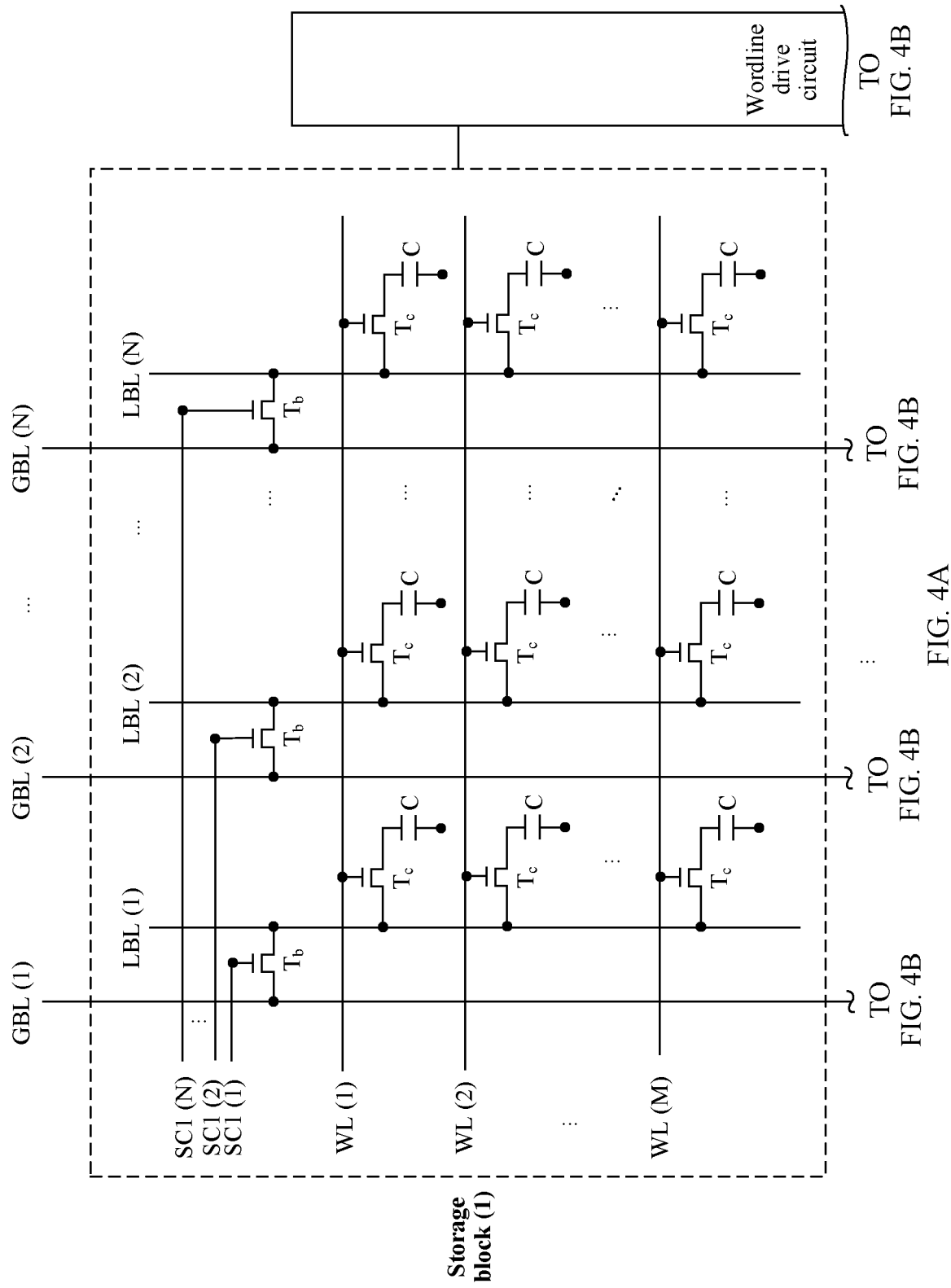
FIG. 4A and FIG. 4B are a schematic diagram of a circuit of another memory according to an embodiment of this application.
Figure 4B:
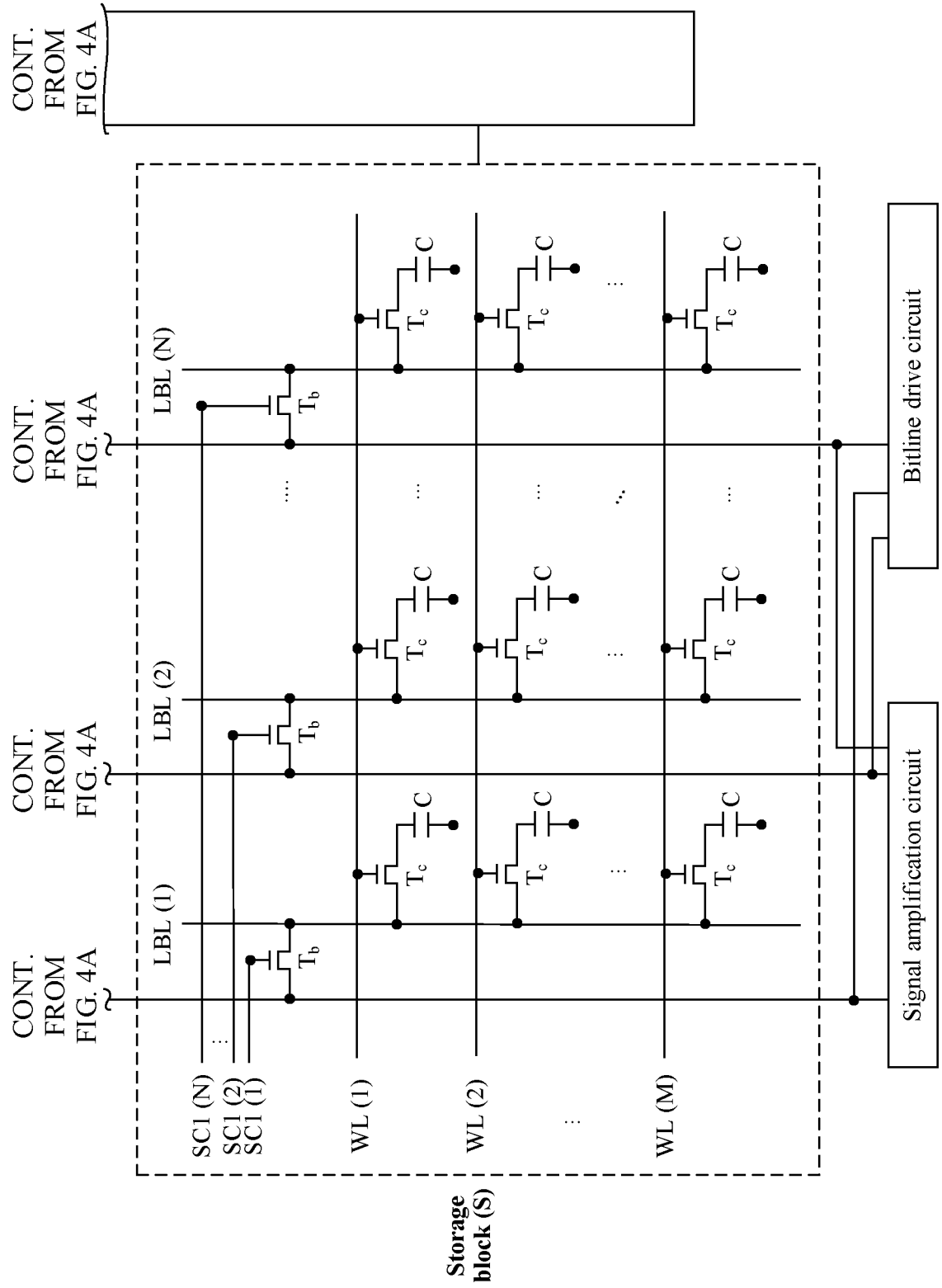

It should be understood that the transistor in the storage unit or the transistor in the bitline switch may include a triode, a field effect transistor, and the like. FIG. 4A and FIG. 4B are a schematic diagram of a circuit of another memory according to an embodiment of this application. In FIG. 4A and FIG. 4B, an example in which the bitline switch is a transistor $T_b$ and the storage unit may be a 1T1C is used for description.

In some embodiments, in the memory shown in FIG. 2A and FIG. 2B or FIG. 4A and FIG. 4B, each storage block may further include N first control lines separately connected to control ends of the N bitline switches, the N first control lines are all connected to a first control circuit (not shown in FIG. 2A and FIG. 2B or FIG. 4A and FIG. 4B), and the first control circuit is configured to control the bitline switches in the S storage blocks to be turned on or off. In each storage block, the N first control lines are represented as SC1 (1), SC1 (2), . . . , and SC1 (N), and SC1 (i) indicates an $i^{th}$ first control line in a storage block. It should be understood that although the N first control lines in each storage block are represented in the same manner, SC1 (i) in any two different storage blocks in the S storage blocks are actually two different first control lines.

For example, when a read/write operation needs to be performed on a storage unit in a storage block, the storage unit needs to be turned on by using a bitline switch connected to a local bitline. In this case, the first control circuit may apply a high potential to a first control line connected to the bitline switch, to turn on the bitline switch. On the contrary, if a read/write operation does not need to be performed, a storage unit on which the read/write operation does not need to be performed is turned off by using a bitline switch connected to a local bitline. In this case, the first control circuit may apply a low potential to a first control line connected to the bitline switch, to turn off the bitline switch. It should be understood that the foregoing is described by using an example in which the bitline switch is an N-type MOS transistor.

In this embodiment of this application, one storage block may include a plurality of storage units arranged in an array, and each storage block includes N columns of storage units. However, storage units in storage blocks may have the same or different rows. For example, as shown in FIG. 2A and FIG. 2B or FIG. 4A and FIG. 4B, storage units in each storage block are arranged as M rows×N columns of storage units. Each storage block further includes M wordlines, storage units in a $j^{th}$ row in the M rows×N columns of storage units are connected to a $j^{th}$ wordline in the M wordlines, M is a positive integer, and j is a positive integer not greater than M.

Figure 5:
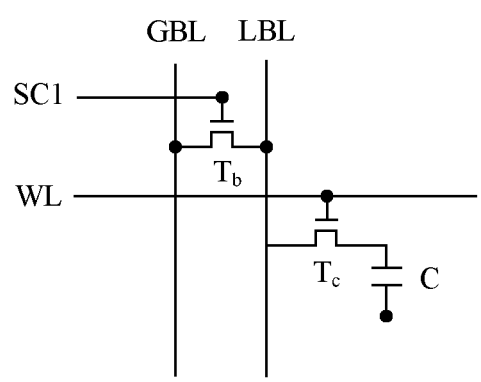
FIG. 5 is a schematic diagram of a working principle of a storage unit according to an embodiment of this application.

FIG. 5 is a schematic diagram of a working principle of a storage unit according to an embodiment of this application. When a read operation or a write operation is performed on the storage unit, a wordline WL and a local bitline LBL that are connected to the storage unit need to be selected. Further, a global bitline GBL connected to the local bitline LBL and SC1 connected to the local bitline LBL need to be selected, to select the local bitline LBL.

An example in which both the transistor $T_b$ and the transistor $T_c$ are N-type MOS transistors is used for description. Selecting the WL means that a high potential is input to the WL, to turn on the transistor $T_c$, and the capacitor C may perform charging/discharging. Selecting the LBL means that a high potential is input to SC1 connected to the LBL, to turn on the transistor $T_b$, the LBL and the GBL connected to the LBL are turned on, and the GBL is selected to output or input an electrical signal, to separately perform the read operation or the write operation.

It should be noted that the memory shown in FIG. 2A and FIG. 2B or FIG. 4A and FIG. 4B is described by using an example in which a total quantity of rows of storage units in each storage block is the same, that is, the total quantity of rows is M. In another embodiment of this application, a total quantity of rows of storage units in different storage blocks may be different. For example, a storage block 1 is an array including M1 rows×N columns of storage units, a storage block 2 is an array including M2 rows×N columns of storage units, where M1 is not equal to M2, and both M1 and M2 are positive integers. Examples are not given herein again.

In some embodiments, the memory further includes the wordline drive circuit, and the wordline drive circuit is connected to all wordlines in the S storage blocks, and is configured to control a potential of the wordline connected to the wordline drive circuit, to control transistors on the wordlines to be turned on and off. For example, a transistor in a storage unit of the wordline drive circuit is an N-type MOS transistor. When a row of storage units needs to be selected, the wordline drive circuit applies a high potential to a wordline connected to the row of storage units. On the contrary, when the row of storage units does not need to be selected, the wordline drive circuit applies a low potential to the wordline connected to the row of storage units.

Figure 6A:
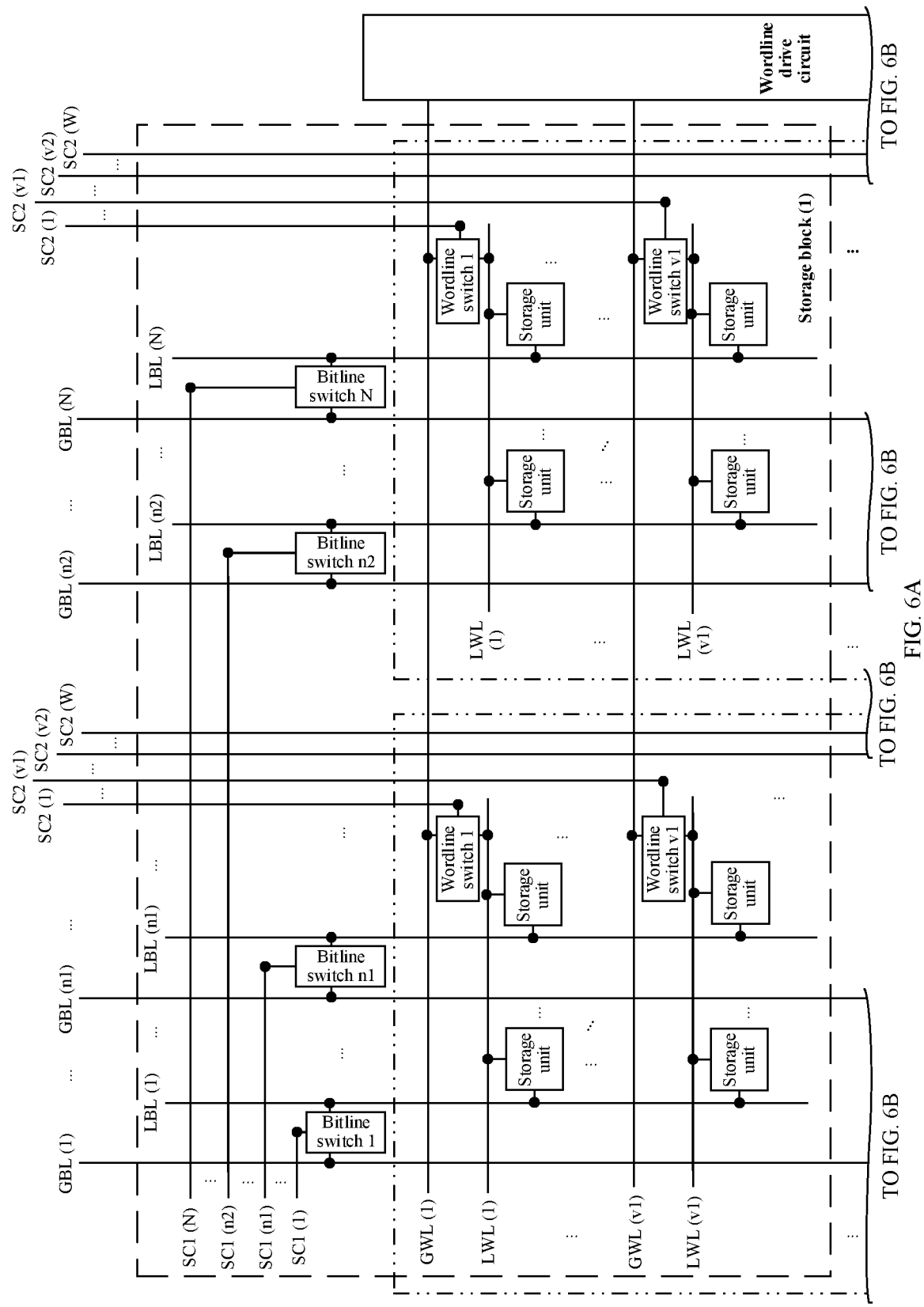
FIG. 6A and FIG. 6B are a schematic diagram of a circuit of still another memory according to an embodiment of this application.
Figure 6B:
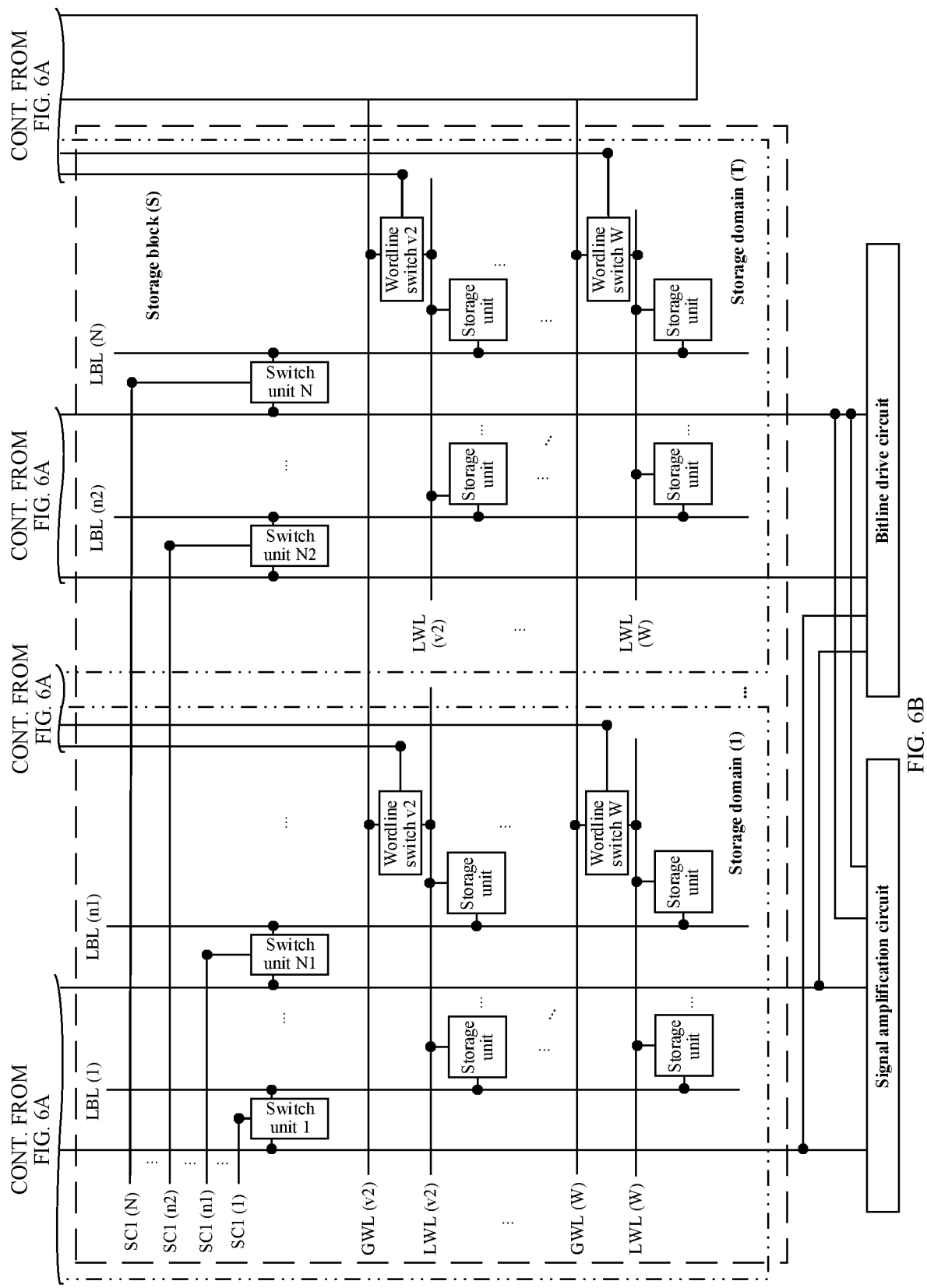

FIG. 6A and FIG. 6B are a schematic diagram of a circuit of still another memory according to an embodiment of this application. In some embodiments, in the memory, each of S storage blocks is divided into T storage sub-blocks, the storage sub-blocks in the memory are arranged in S rows×T columns, each column of storage sub-blocks forms one storage domain, the memory may include T storage domains, the memory further includes W global wordlines, T and W are positive integers, T≥2, and each of the T storage domains includes W rows of storage units, W local wordlines, and W wordline switches.

In each storage domain, storage units in a $v^{th}$ row in the W rows of storage units are connected to a $v^{th}$ local wordline in the W local wordlines, the $v^{th}$ local wordline is connected to a with local wordline in the W global wordlines by using a $v^{th}$ wordline switch in the W wordline switches, W is a positive integer, and v is a positive integer not greater than W.

Figure 7:
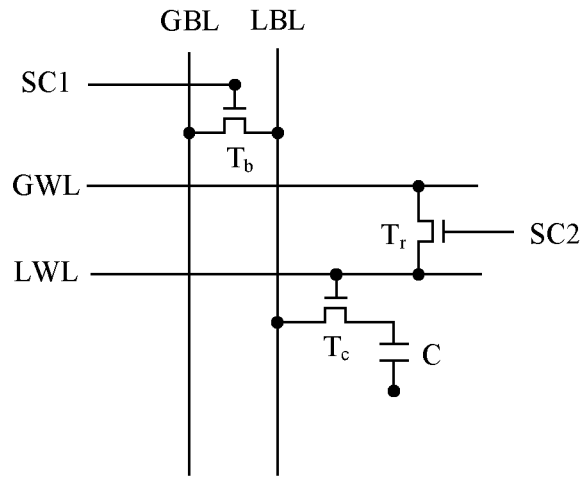
FIG. 7 is a schematic diagram of a working principle of a storage unit according to an embodiment of this application.

FIG. 7 is a schematic diagram of a working principle of another storage unit according to an embodiment of this application. When a read operation or a write operation is performed on the storage unit, a local wordline LWL and a local bitline LBL that are connected to the storage unit need to be selected. Further, a global bitline GBL connected to the local bitline LBL and SC1 connected to the local bitline LBL need to be selected, to select the local bitline LBL. A global wordline GWL connected to the local wordline LWL and SC2 connected to the local wordline LWL need to be selected, to select the local wordline LWL.

An example in which both the transistor $T_b$, the transistor $T_c$, and a transistor $T_r$ are N-type MOS transistors is used for description. Selecting the LWL means that a high potential is input to SC2 connected to the LWL, to turn on the transistor $T_r$, the LWL and the GWL connected to the LWL are turned on, and a high potential is input to the GWL, to turn on the transistor $T_c$, and the capacitor C may perform charging/discharging. Selecting the LBL means that a high potential is input to SC1 connected to the LBL, to turn on the transistor $T_b$, the LBL and the GBL connected to the LBL are turned on, and the GBL is selected to output or input an electrical signal, to separately perform the read operation or the write operation.

It should be understood that quantities of columns of storage units in storage domains may be the same or different. This is not limited herein. As shown in FIG. 6A and FIG. 6B, a storage domain (1) includes n1 columns of storage units, and a memory (T) includes N−n2 columns of storage units, where n1 is a positive integer greater than 1, and n2 is a positive integer less than N. Optionally, N is a multiple of T, and each storage domain includes storage units of a same quantity of columns, namely, N/T columns. It should further be understood that quantities of rows of storage units in storage domains may be the same or different. This is not limited herein. For example, in the memory shown in FIG. 5, a storage block (1) is an array including v1 rows×N columns of storage units, a storage block (S) is an array including v2 rows×N columns of storage units, v1 is a positive integer greater than 1, v2 is a positive integer less than W, and W is a positive integer greater than 1. Herein, an example in which the memory includes W rows×N columns of storage units is used for description.

In the memory shown in FIG. 6A and FIG. 6B, T storage domains are represented as a storage domain 1, a storage domain 2, . . . , and a storage domain T. The W global wordlines are represented as a GWL (1), a GWL (2), . . . , and a GWL (W), and a GWL (v) indicates the $v^{th}$ global wordline in the W global wordlines. In each storage domain, the W local wordlines are represented as an LWL (1), an LWL (2), . . . , and an LWL (W), the W wordline switches are represented as a wordline switch 1, a wordline switch 2, . . . , and a wordline switch W, an LWL (v) indicates a $v^{th}$ local wordline in a storage domain, and a wordline switch v indicates a $v^{th}$ wordline switch in a storage domain. It should be understood that although the W local wordlines and the W wordline switches in the storage domains are represented in the same manner, LWLs (v) in any two different storage domains in the T storage domains are actually two different local wordlines. Similarly, wordline switches v in any two different storage domains are actually two different wordline switches.

In an embodiment, each storage block is a storage unit array including N columns of storage units, the S storage blocks are arranged in a bitline direction to form a storage block array, and the storage block array also includes N columns of storage units. In this case, each storage block is divided into T storage sub-blocks, each storage sub-block is a storage unit array smaller than a storage block, and a quantity of columns of storage units in a $t^{th}$ storage sub-block in each storage block is the same. All storage sub-blocks in the memory are arranged into S rows×T columns of storage sub-blocks. Herein, an area including one column of storage sub-blocks is referred to as a storage domain, and the memory includes T storage domains. Storage units in a $v^{th}$ row in each storage domain are still in a $v^{th}$ row in the memory array including the T storage domains. For one storage domain, each of storage units in a $v^{th}$ row is connected to a $v^{th}$ local wordline, and the $v^{th}$ local wordline is connected to a $v^{th}$ global wordline by using a $v^{th}$ wordline switch.

It can be learned that the $v^{th}$ local wordline in each storage domain is connected to the same global wordline, namely, the $v^{th}$ global wordline, by using one wordline switch. In this case, the $v^{th}$ local wordline and the $v^{th}$ global wordline in each storage domain may be controlled to be turned on or off by controlling the $v^{th}$ wordline switch in each storage domain to be turned on or off. Therefore, $v^{th}$ local wordlines in the T storage domains can share one global wordline, and the T storage domains can share one wordline drive circuit, to reduce a quantity of wordline drive circuits in the memory, and reduce preparation costs of the memory. In addition, a memory array is fine-grained. This can shorten the local wordline, reduce parasitic capacitance caused by the local wordline, and reduce a delay of a read/write operation.

Optionally, in the memory shown in FIG. 6A and FIG. 6B, each storage domain may further include W second control lines separately connected to W wordline switches, the W second control lines are all connected to a second control circuit (not shown in FIG. 6A and FIG. 6B), and the second control circuit is configured to control the wordline switches in the T storage domains to be turned on or off.

In each storage domain, the W second control lines are represented as SC2 (1), SC2 (2), . . . , and SC2 (W), and SC2 (v) indicates a $v^{th}$ second control line in a storage domain. It should be understood that although the W second control lines in each storage domain are represented in the same manner, SC2 (v) in any two different storage domains in the T storage domains are actually two different second control lines.

In some embodiments, the memory may further include the wordline drive circuit, and the wordline drive circuit is connected to global wordlines in the T storage domains, and is configured to control potentials of the global wordlines in the T storage domains. It should be understood that the wordline drive circuit controls, by controlling the potentials of the global wordlines, potentials of T local wordlines connected to the global wordlines, and further selects, by turning on one or more wordline switches in T wordline switches connected to the global wordlines, storage units on a local wordline connected to the one or more wordline switches.

For example, when a read/write operation needs to be performed on a storage unit, the storage unit needs to be turned on by using a wordline switch connected to a local wordline. In this case, the second control circuit may apply a high potential to a second control line connected to the wordline switch, to turn on the wordline switch; and apply, by using the wordline drive circuit, a high potential to a global wordline connected to the storage unit. In this case, the global wordline connected to the storage unit and the local wordline connected to the storage unit are turned on, and a high potential is applied to a control end of a transistor in the storage unit, to select the storage unit. On the contrary, if a read/write operation does not need to be performed, a storage unit on which the read/write operation does not need to be performed is turned off by using a wordline switch connected to a local wordline. In this case, the second control circuit may apply a low potential to a second control line connected to the wordline switch, to turn off the wordline switch. It should be understood that the foregoing is described by using an example in which the wordline switch is an N-type MOS transistor.

Figure 8:
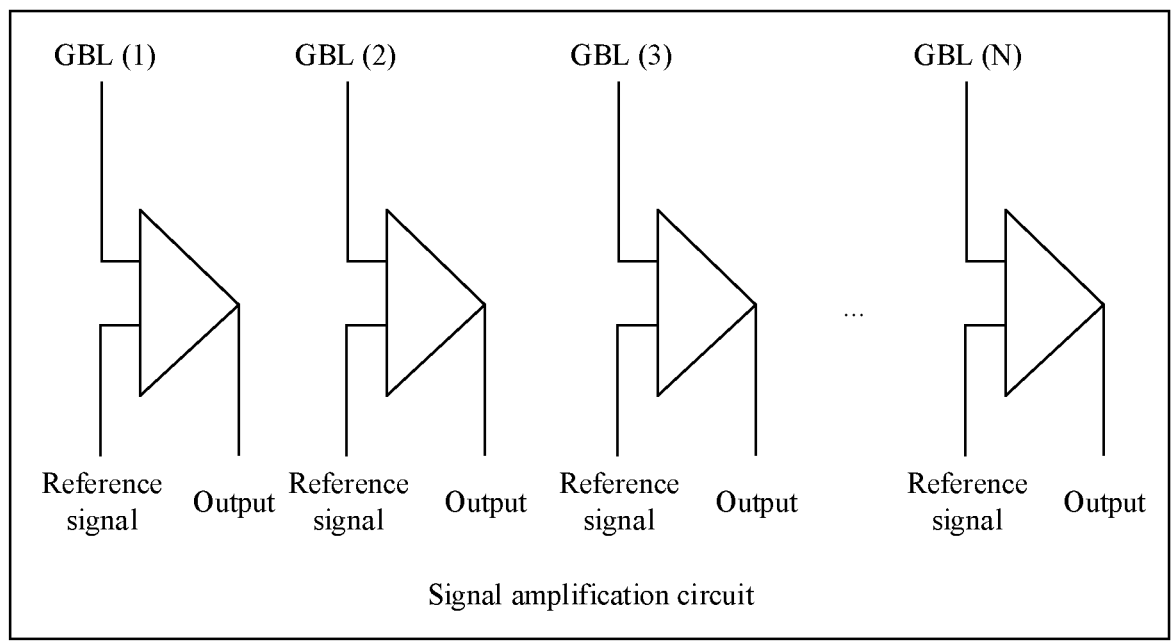
FIG. 8 is a schematic diagram of a circuit of a signal amplification circuit according to an embodiment of this application.
Figure 9:
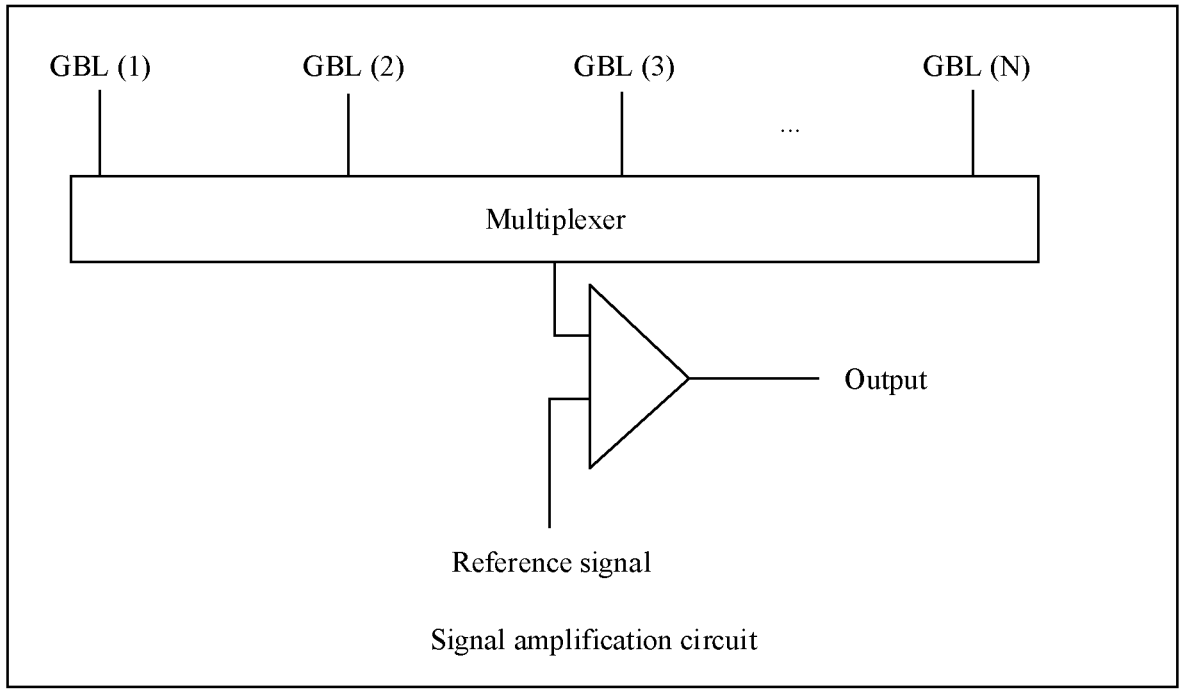
FIG. 9 is a schematic diagram of a circuit of another signal amplification circuit according to an embodiment of this application.

It should be understood that the signal amplification circuit works when a read operation is performed on the storage unit in the memory. FIG. 8 and FIG. 9 are schematic diagrams of circuits of two signal amplification circuits according to embodiments of this application.

FIG. 8 shows a signal amplification circuit. The signal amplification circuit may include N differential amplifiers, the N differential amplifiers are in a one-to-one correspondence with N global bitlines, and an $i^{th}$ differential amplifier in the N differential amplifiers is configured to amplify an electrical signal on an $i^{th}$ global bitline.

During actual application, an input end of the $i^{th}$ differential amplifier is connected to the $i^{th}$ global bitline, the electrical signal on the $i^{th}$ global bitline is input, and another input end is connected to a reference signal. The $i^{th}$ differential amplifier outputs a signal obtained after the reference signal is removed from the electrical signal on the $i^{th}$ global bitline, and further identifies data corresponding to the output signal.

The memory combined with the signal amplification circuit shown in FIG. 8 can simultaneously read data in storage units in different columns, to increase a read operation speed of the memory.

In some embodiments, the signal amplification circuit may include P multiplexers and P differential amplifiers. The multiplexers are in a one-to-one correspondence with the differential amplifiers, an input end of a $k^{th}$ multiplexer in the P multiplexers is connected to at least two of the N global bitlines, an output end of the $k^{th}$ multiplexer in the P multiplexers is connected to a $k^{th}$ differential amplifier in the P differential amplifiers, the $k^{th}$ multiplexer in the P multiplexers is configured to select, for outputting, one electrical signal from electrical signals transmitted on the global bitlines connected to the $k^{th}$ multiplexer, P is a positive integer not greater than N, and k is a positive integer not greater than P.

In the memory using the signal amplification circuit, data in a plurality of storage units indirectly connected to different multiplexers may be simultaneously read. This can increase a read operation speed and reduce costs.

FIG. 9 shows another signal amplification circuit, where P=1. In this case, all global bitlines share one differential amplifier. The memory can only read data in one storage unit in one read operation.

It should be understood that the memory may further include another functional unit, for example, a decoder, configured to implement data reading and writing of the memory. This is not limited herein.

Figure 10:
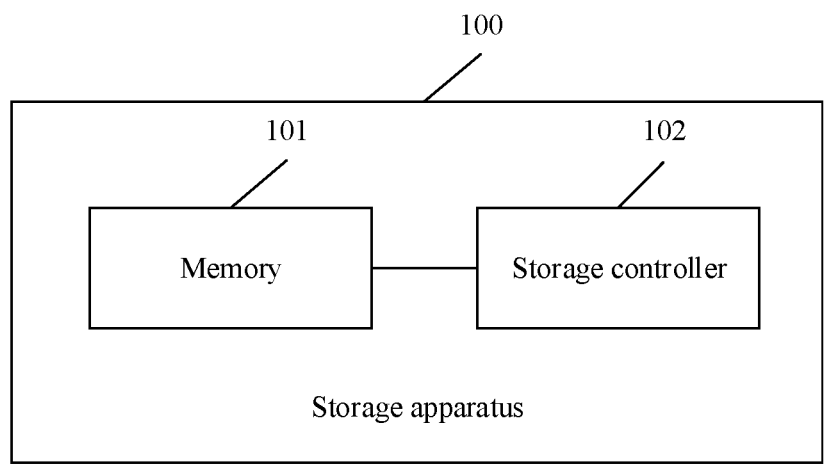
FIG. 10 is a schematic diagram of a structure of a storage apparatus according to an embodiment of this application.

FIG. 10 shows a storage apparatus 100 according to an embodiment of this application. The storage apparatus 100 may include a memory 101 and a storage controller 102. The storage controller 102 is coupled to the memory 101. The memory may be any memory described in FIG. 2A and FIG. 2B, FIG. 4A and FIG. 4B, or FIG. 6A and FIG. 6B.

In some embodiments, the storage apparatus 100 may be a memory. The storage controller is a memory controller, and is configured to receive a request sent by a processor for a target storage unit, and respond to the request by using the target storage unit in the storage apparatus. The request includes a read request and a write request.

In some embodiments, the storage apparatus may be another memory, for example, a cache memory or a DRAM. This is not limited herein.

Figure 11A:
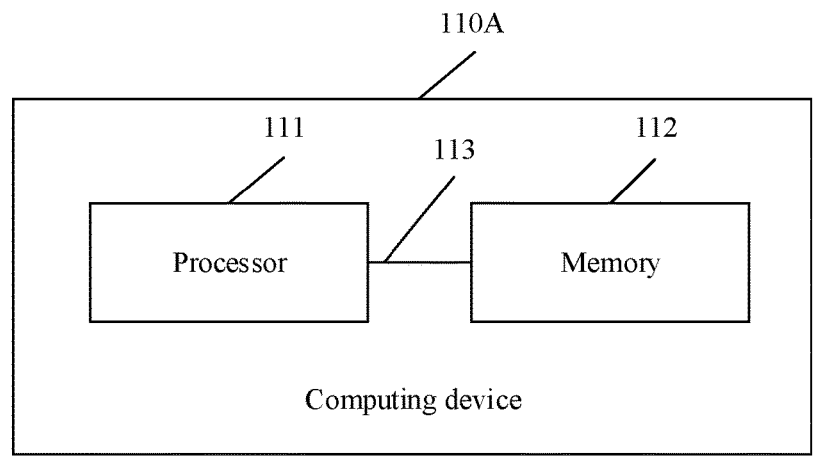
FIG. 11A is a schematic diagram of a structure of a computing device according to an embodiment of this application.

FIG. 11A shows a computing device 110A according to an embodiment of this application. The computing device 110A may include a processor 111 and a memory 112. The processor 111 is coupled to the memory 112, for example, by using a bus 113. The memory 112 may be any memory described in FIG. 2A and FIG. 2B, FIG. 4A and FIG. 4B, or FIG. 6A and FIG. 6B.

Figure 11B:
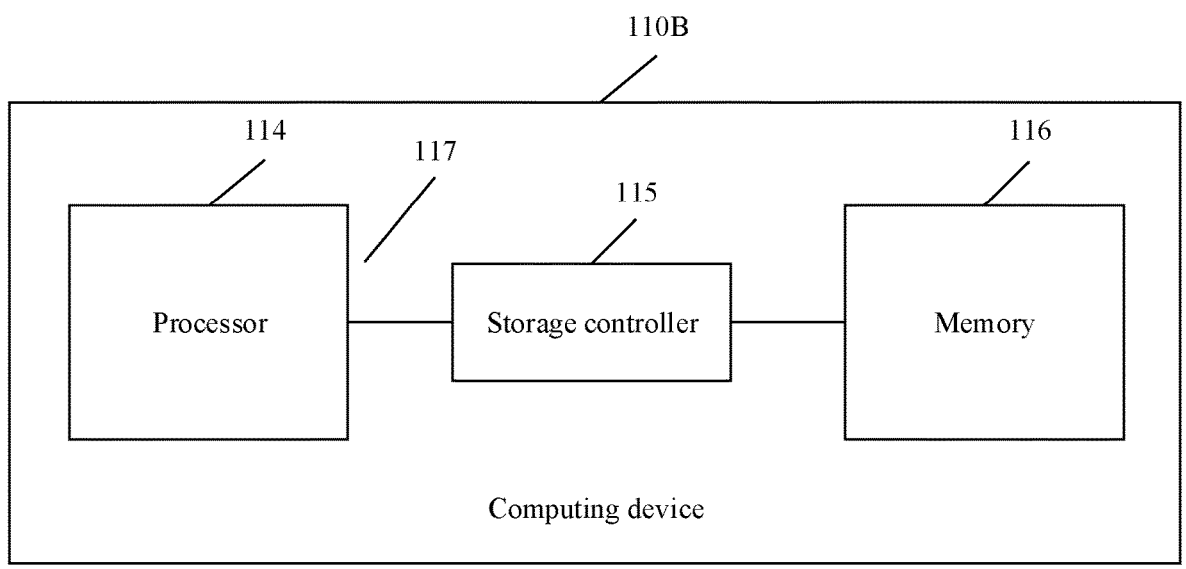
FIG. 11B is a schematic diagram of a structure of another computing device according to an embodiment of this application.

FIG. 11B shows another computing device 110B according to an embodiment of this application. The computing device 110B may include a processor 114, a storage controller 115, and a memory 116. The processor 111 is coupled to the storage controller 115, and the storage controller 115 is coupled to the memory 116. The memory 116 may be any memory described in FIG. 2A and FIG. 2B, FIG. 4A and FIG. 4B, or FIG. 6A and FIG. 6B.

The computing device may be a terminal, for example, a mobile phone, a tablet computer, a notebook computer, a personal computer, a smart television, a set-top box, a smartwatch, a smart band, a virtual reality (VR) device, an augmented reality (AR) device, or a smart speaker. Alternatively, the computing device may be a device that includes a memory and has a data processing function, such as a router, a server, a cloud server, or a cloud computing device.

With reference to the memory in FIG. 2A and FIG. 2B, FIG. 4A and FIG. 4B, or FIG. 6A and FIG. 6B, the storage apparatus in FIG. 10, and the computing device in FIG. 11A and FIG. 11B, the following describes a data reading method according to an embodiment of this application. The method is performed by a storage controller, or a storage apparatus including a storage controller and a computing device. The method may include but is not limited to the following steps.

S12: Select a target storage unit in a target storage block, where the target storage unit is connected to a $y^{th}$ local bitline in the target storage block, and y is a positive integer not greater than N.

Optionally, selecting the target storage unit means that a transistor, for example, the transistor $T_c$ in the storage unit in FIG. 3, in the target storage unit is turned on. A high potential signal is input to a wordline connected to the target storage unit, to transmit an electrical signal stored in the target storage unit to the local bitline, or transmit the electrical signal in the local bitline to the target storage unit.

In an implementation of this embodiment of this application, the storage controller receives a read request from a processor. The read request is used to request to read data in the target storage unit in the target storage block, and the read request carries address information indicating a location of the target storage unit. After receiving the read request, the storage controller may determine a row address and a column address of the target storage unit in a memory based on the address information. The column address indicates an identifier of a column in which the target storage unit is located, and the row address indicates an identifier of a row in which the target storage unit is located.

It should be understood that one local bitline and one wordline in a storage block may determine a location of a storage unit, and the column address in which the target storage unit is located may include an identifier of the local bitline connected to the target storage unit. Similarly, the row address in which the target storage unit is located may include an identifier of the wordline or the local wordline connected to the target storage unit.

For example, when the memory is the memory shown in FIG. 2A and FIG. 2B or FIG. 4A and FIG. 4B, the target storage unit is connected to an $x1^{th}$ wordline and the $y^{th}$ local bitline in the target storage block, where x1≤W, y≤N, W is a total quantity of rows of storage units in the storage block, and N is a total quantity of columns of storage addresses in the storage block.

For another example, when the memory is the memory shown in FIG. 6A and FIG. 6B, the target storage unit is connected to an $x2^{th}$ local wordline in a target storage domain, and is connected to the $y^{th}$ local bitline in the target storage block, where x2≤W, y≤N, W is a total quantity of rows of storage units in the storage block, and N is a total quantity of columns of storage addresses in the storage block.

Optionally, the storage controller may obtain, by using a decoder, the row address and the column address in which the target storage unit is located and that are determined by using the address information, and further determine the local bitline, the wordline, or the local wordline connected to the target storage unit. The following separately describes two implementations for selecting the target memory for the memory shown in FIG. 2A and FIG. 2B or FIG. 4A and FIG. 4B, and the memory shown in FIG. 6A and FIG. 6B.

Implementation 1

When the memory is the memory shown in FIG. 2A and FIG. 2B or FIG. 4A and FIG. 4B, the storage controller may input, to the $x1^{th}$ wordline in the target storage block by using a wordline drive circuit, a control signal used to select the target storage unit.

For example, a transistor in a storage unit is an N-type MOS transistor. When a row of storage units needs to be selected, the wordline drive circuit applies a high potential to the $x1^{th}$ wordline connected to the target storage unit. In this case, the storage units in the $x1^{th}$ row in the target storage block are selected, and the target storage unit is selected.

Implementation 2

When the memory is the memory shown in FIG. 6A and FIG. 6B, the storage controller may turn on an $x2^{th}$ wordline switch in the target storage domain, to turn on the $x2^{th}$ local wordline in the target storage domain and an $x2^{th}$ global wordline in W global wordlines; and further input, to the $x2^{th}$ global wordline in the W global wordlines by using the wordline drive circuit, a control signal used to select the target storage unit.

An implementation in which the storage controller turns on the $x2^{th}$ wordline switch in the target storage domain may be: The storage controller inputs, to a second control line, namely, SC2 (x2), connected to the $x2^{th}$ wordline switch, a control signal used to turn on the $x2^{th}$ wordline switch. If the wordline switch is an N-type MOS transistor, the control signal may be a high potential.

It should be understood that the storage controller may first input the control signal to the $x2^{th}$ global wordline in the W global wordlines, and then turn on the $x2^{th}$ wordline switch.

If the transistor in the storage unit is an N-type MOS transistor, the control signal may be a high potential. When the wordline drive circuit applies a high potential to the $x2^{th}$ global wordline, because the $x2^{th}$ wordline switch in the target storage domain is turned on, the high potential on the $x2^{th}$ global wordline is applied to all storage units in an $x2^{th}$ row in the target storage domain by using the $x2^{th}$ local wordline in the target storage domain, all storage units in the $x2^{th}$ row in the target storage domain are selected, and the target storage unit is also selected.

S14: Turn on a $y^{th}$ bitline switch in the target storage block, to transmit an electrical signal in the target storage unit in the target memory to a $y^{th}$ global bitline in N global bitlines by using the $y^{th}$ local bitline.

It may be understood that after the $y^{th}$ bitline switch in the target storage block is turned on, the $y^{th}$ local bitline in the target memory and the $y^{th}$ global bitline in the N global bitlines are turned on.

An implementation in which the storage controller turns on the $y^{th}$ bitline switch in the target storage block may be: The storage controller inputs, to a first control line, namely, SC1 (y), connected to the $y^{th}$ bitline switch in the target storage block, a control signal used to turn on the $y^{th}$ bitline switch. If the bitline switch is an N-type MOS transistor, the control signal may be a high potential.

S16: The signal amplification circuit amplifies the electrical signal on the $y^{th}$ global bitline.

For the signal amplification circuit (as shown in FIG. 8) including the N differential amplifiers, an implementation of S16 may be: The storage controller amplifies, by using a target differential amplifier, the electrical signal on the $y^{th}$ global bitline, where the target differential amplifier is a differential amplifier, in the N differential amplifiers, that is connected to the $y^{th}$ global bitline.

For the signal amplification circuit (as shown in FIG. 9) including the P differential amplifiers and the P multiplexers, an implementation of S16 may be: The storage controller inputs, by using a target multiplexer connected to the $y^{th}$ global bitline, the electronic signal on the $y^{th}$ global bitline to a target differential amplifier connected to the target multiplexer. The target multiplexer is a multiplexer, in the P multiplexers, that is connected to the $y^{th}$ global bitline, and is configured to transmit the electronic signal on the $y^{th}$ global bitline to the differential amplifier (which is referred to as the target differential amplifier herein) connected to the target multiplexer. The storage controller further amplifies, by using the target differential amplifier, the electronic signal on the $y^{th}$ global bitline.

Further, the storage controller may read data corresponding to the electrical signal, and send the read data to the processor.

It should be understood that an objective of amplifying the electrical signal on the $y^{th}$ global bitline is to remove a reference signal from the electrical signal, so that an amplified signal is closer to a signal stored in the target storage unit in the target storage block, to accurately identify data in the target storage unit.

With reference to the memory in FIG. 2A and FIG. 2B, FIG. 4A and FIG. 4B, or FIG. 6A and FIG. 6B, the storage apparatus in FIG. 10, and the computing device in FIG. 11A and FIG. 11B, the following describes a data writing method according to an embodiment of this application. The method is performed by a storage controller, or a storage apparatus including a storage controller and a computing device. The method may include but is not limited to the following steps.

S22: Select a target storage unit in a target storage block, where the target storage unit is connected to a $y^{th}$ local bitline in the target storage block, and y is a positive integer not greater than N.

In an implementation of this embodiment of this application, the storage controller receives a write request from a processor. The write request is used to request to write target data into the target storage unit in the target storage block, and the write request carries address information indicating a location of the target storage block. After receiving the write request, the storage controller may determine a row address and a column address of the target storage unit in a memory based on the address information. The column address indicates an identifier of a column in which the target storage unit is located, and the row address indicates an identifier of a row in which the target storage unit is located.

An implementation of determining the row address and the column address of the target storage unit in the target storage block based on the address information carried in the write request is the same as an implementation of determining the row address and the column address of the target storage unit in the target storage block based on the address information carried in the read request. For details, refer to related descriptions in the embodiment of the data reading method shown in FIG. 12. Details are not described herein again.

It should be understood that one local bitline and one wordline in a storage block may determine a location of a storage unit, and the column address in which the target storage unit is located may include an identifier of the local bitline connected to the target storage unit. Similarly, the row address in which the target storage unit is located may include an identifier of the wordline or the local wordline connected to the target storage unit.

For example, when the memory is the memory shown in FIG. 2A and FIG. 2B or FIG. 4A and FIG. 4B, the target storage unit is connected to an $x1^{th}$ wordline and the $y^{th}$ local bitline in the target storage block, where x1≤W, y≤N, W is a total quantity of rows of storage units in the storage block, and N is a total quantity of columns of storage addresses in the storage block. For another example, when the memory is the memory shown in FIG. 6A and FIG. 6B, the target storage unit is connected to an $x2^{th}$ local wordline in a target storage domain, and is connected to the $y^{th}$ local bitline in the target storage block, where x2≤W, y≤N, W is a total quantity of rows of storage units in the storage block, and N is a total quantity of columns of storage addresses in the storage block.

Figure 12:
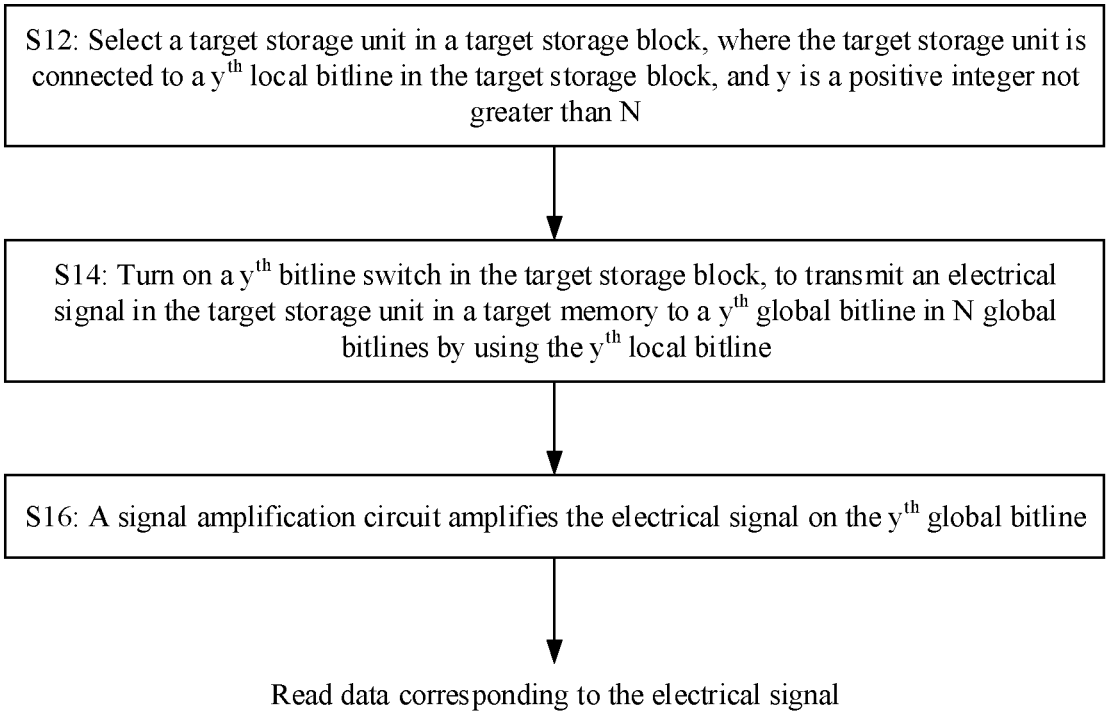
FIG. 12 is a schematic flowchart of a data reading method according to an embodiment of this application.
Figure 13:
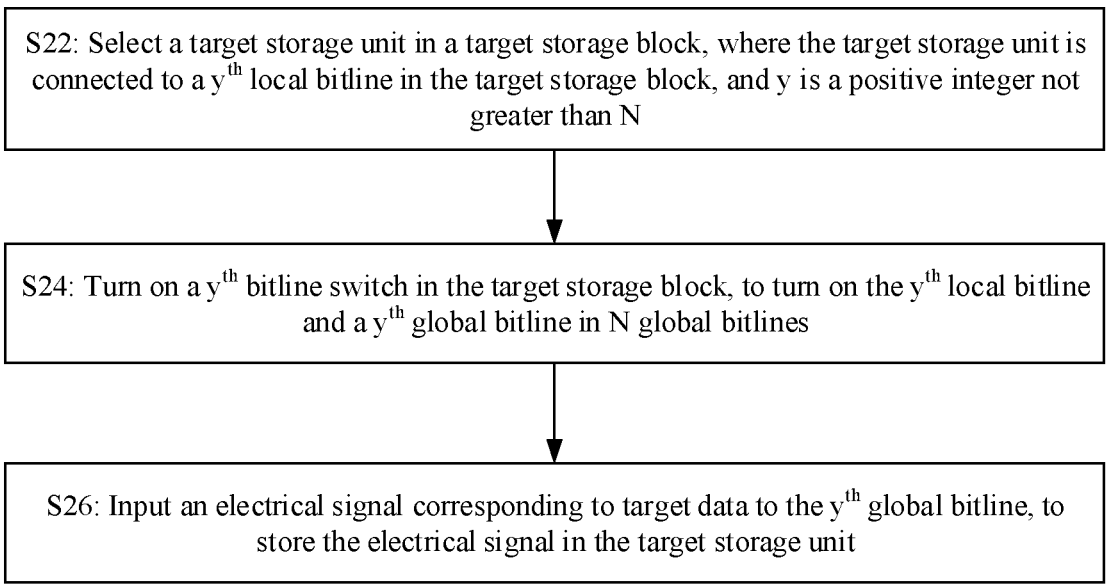
FIG. 13 is a schematic flowchart of a data writing method according to an embodiment of this application.

Although descriptions such as y, x1, x2, the target storage block, the target storage unit, and the target storage domain are used in both the embodiment of the data reading method shown in FIG. 12 and the embodiment of the data writing method shown in FIG. 13, it should be understood that a positive integer indicated by y, a positive integer indicated by x1, a positive integer indicated by x2, a storage block indicated by the target storage block, a storage unit indicated by the target storage unit, and a storage domain indicated by the target storage domain in the two method embodiments may be different.

For a specific implementation of selecting the target storage unit, refer to the specific implementation of selecting the target storage unit in the embodiment of the data reading method shown in FIG. 12. Details are not described herein again.

S24: Turn on a $y^{th}$ bitline switch in the target storage block, to turn on the $y^{th}$ local bitline and a $y^{th}$ global bitline in N global bitlines.

For a specific implementation of S24, refer to related descriptions in step S14 in the method embodiment shown in FIG. 12. Details are not described herein again.

S26: Input an electrical signal corresponding to target data to the $y^{th}$ global bitline, to store the electrical signal in the target storage unit.

For example, the storage unit includes only two states: "0" and "1". Stage "1" corresponds to a high potential, and the data "0" corresponds to a low potential.

It should be understood that when the target storage unit is selected, the electrical signal corresponding to the target data may be input to the $y^{th}$ global bitline by using a bitline drive circuit. Because the $y^{th}$ bitline switch in the target storage block is turned on, the electrical signal may be transmitted to the target storage unit by using the $y^{th}$ local bitline in the target storage block, and the electrical signal may be stored in a capacitor in the target storage unit.

Figure 14:
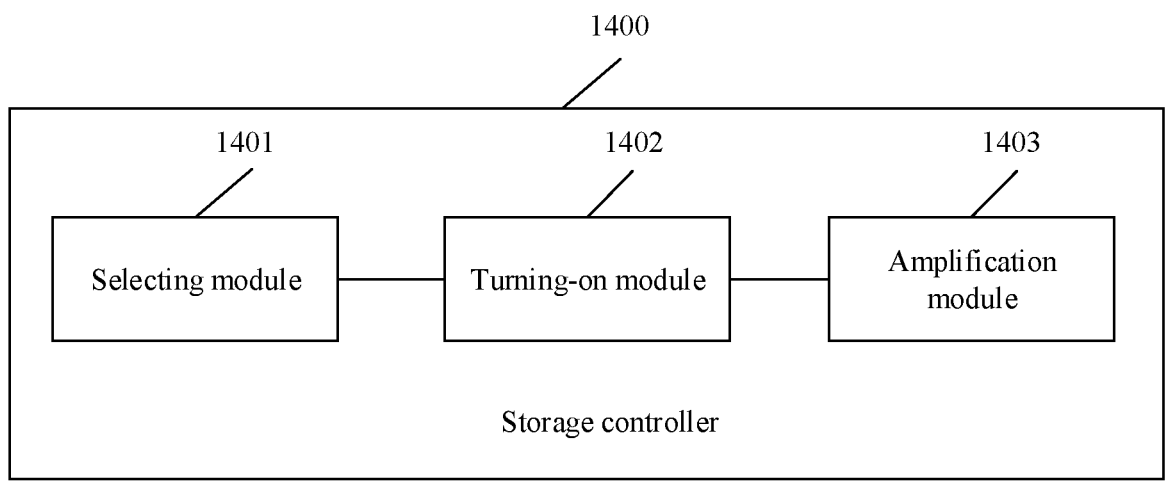
FIG. 14 is a schematic diagram of a structure of a storage controller according to an embodiment of this application.

FIG. 14 shows a storage controller 1400 according to an embodiment of this application. The storage controller 1400 may be applied to the memory shown in FIG. 2A and FIG. 2B, FIG. 4A and FIG. 4B, or FIG. 6A and FIG. 6B, the storage apparatus described in FIG. 10, and the computing device described in FIG. 11A and FIG. 11B. The storage controller 1400 may include the following functional units:

a selecting module 1401, configured to select a target storage unit in a target storage block, where the target storage unit is connected to a $y^{th}$ local bitline in the target storage block, and y is a positive integer not greater than N;

a turning-on module 1402, configured to turn on a $y^{th}$ bitline switch in the target storage block, to transmit an electronic signal in the target storage unit to a $y^{th}$ global bitline in N global bitlines by using the $y^{th}$ local bitline; and an amplification module 1403, configured to amplify, by using a signal amplification circuit, the electrical signal on the $y^{th}$ global bitline.

In an optional implementation, in correspondence with the memory including the signal amplification circuit shown in FIG. 8, the amplification module 1403 is specifically configured to amplify, by using a target differential amplifier, the electrical signal on the $y^{th}$ global bitline, where the target differential amplifier is a differential amplifier, in the N differential amplifiers, that is connected to the $y^{th}$ global bitline.

In an optional implementation, in correspondence with the memory (the memory including the signal amplification circuit shown in FIG. 9) including the P multiplexers and the P differential amplifiers, the amplification module 1403 is specifically configured to: input, by using a target multiplexer connected to the $y^{th}$ global bitline, the electrical signal on the $y^{th}$ global bitline to a target differential amplifier connected to the target multiplexer; and amplify, by using the target differential amplifier, the electrical signal on the $y^{th}$ global bitline.

In an optional implementation, each storage block further includes N first control lines separately connected to control ends of N bitline switches, and the turning-on module 1402 is specifically configured to input, to a first control line connected to the $y^{th}$ bitline switch, a control signal used to turn on the $y^{th}$ bitline switch.

In an optional implementation, in correspondence with the memory shown in FIG. 2A and FIG. 2B or FIG. 4A and FIG. 4B, the target storage unit is connected to an $x1^{th}$ wordline in the target storage block, x1 is a positive integer not greater than M, and the selecting module 1401 is specifically configured to: input, to the $x1^{th}$ wordline, a control signal used to select the target storage unit.

In an optional implementation, in correspondence with the memory shown in FIG. 6A and FIG. 6B, the target storage unit is connected to an $x2^{th}$ local wordline in a target storage domain, x2 is a positive integer not greater than W, and the selecting module 1401 is specifically configured to: turn on an $x2^{th}$ wordline switch in the target storage domain, to turn on the $x2^{th}$ local wordline and an $x2^{th}$ global wordline in W global wordlines; and input, to the $x2^{th}$ global wordline in the W global wordlines, a control signal used to select the target storage unit.

Optionally, the storage domain further includes W second control lines separately connected to W wordline switches, the turning-on module 1402 is specifically configured to input, to a second control line connected to the $x2^{th}$ wordline switch, a control signal used to turn on the $x2^{th}$ wordline switch.

For specific implementations of modules in the storage controller 1400, refer to related descriptions in the memory shown in FIG. 2A and FIG. 2B, FIG. 4A and FIG. 4B, or FIG. 6A and FIG. 6B, and the method embodiment shown in FIG. 12. Details are not described herein again.

Figure 15:
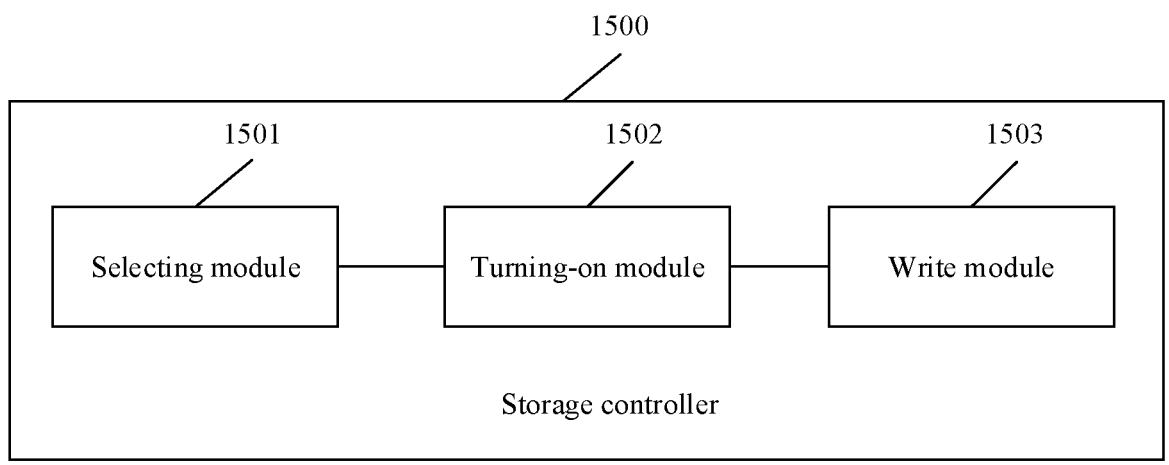
FIG. 15 is a schematic diagram of a structure of another storage controller according to an embodiment of this application.

FIG. 15 shows another storage controller 1500 according to an embodiment of this application. The storage controller 1500 may be applied to the memory shown in FIG. 2A and FIG. 2B, FIG. 4A and FIG. 4B, or FIG. 6A and FIG. 6B, the storage apparatus described in FIG. 10, and the computing device described in FIG. 11A and FIG. 11B. The storage controller 1500 may include the following functional units:

a selecting module 1501, configured to select a target storage unit in a target storage block, where the target storage unit is connected to a $y^{th}$ local bitline in the target storage block, and y is a positive integer not greater than N;

a turning-on module 1502, configured to turn on a $y^{th}$ bitline switch in the target storage block, to turn on the $y^{th}$ local bitline and a $y^{th}$ global bitline in the N global bitlines; and a write module 1503, configured to input an electrical signal corresponding to target data to the $y^{th}$ global bitline, to store the electrical signal in the target storage unit.

In an optional implementation, each storage block further includes N first control lines separately connected to control ends of N bitline switches, the turning-on module 1502 is specifically configured to input, to a first control line connected to the $y^{th}$ bitline switch, a control signal used to turn on the $y^{th}$ bitline switch.

In an optional implementation, in correspondence with the memory shown in FIG. 2A and FIG. 2B or FIG. 4A and FIG. 4B, the target storage unit is connected to an $x1^{th}$ wordline in the target storage block, x1 is a positive integer not greater than M, and the selecting module 1501 is specifically configured to: input, to the $x1^{th}$ wordline, a control signal used to select the target storage unit.

In an optional implementation, in correspondence with the memory shown in FIG. 6A and FIG. 6B, the target storage unit is connected to an $x2^{th}$ wordline in a target storage domain, x2 is a positive integer not greater than W, and the selecting module 1501 is specifically configured to: turn on an $x2^{th}$ wordline switch in the target storage domain, to turn on a global wordline and a local wordline that correspond to a row address; and input, to an $x2^{th}$ global wordline in W global wordlines, a control signal used to select the target storage unit.

Optionally, the storage domain further includes W second control lines separately connected to W wordline switches, the turning-on module 1502 is specifically configured to input, to a second control line connected to the $x2^{th}$ wordline switch, a control signal used to turn on the $x2^{th}$ wordline switch.

For specific implementations of modules in the storage controller 1500, refer to related descriptions in the memory shown in FIG. 2A and FIG. 2B, FIG. 4A and FIG. 4B, or FIG. 6A and FIG. 6B, and the method embodiment shown in FIG. 13. Details are not described herein again.

The foregoing is described by using an example in which the transistor is an N-type MOS transistor. It should be understood that transistors of different types are controlled to be turned on and cut off in different manners. Specific implementation is the conventional technology, and details are not described herein. In addition, in this application, the "control end of the transistor" may be a gate of a field effect transistor, a base of a triode, or the like, and is respectively configured to control a source and a drain of the field effect transistor to be turned on, and a collector and an emitter to be turned on.

A person of ordinary skill in the art may be aware that, with reference to the examples described in embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

A person skilled in the art can appreciate that functions described with reference to various illustrative logical blocks, modules, and algorithm steps disclosed and described herein may be implemented by hardware, software, firmware, or any combination thereof. If implemented by software, the functions described with reference to the illustrative logical blocks, modules, and steps may be stored in or transmitted over a computer-readable medium as one or more instructions or code and executed by a hardware-based processing unit. The computer-readable medium may include a computer-readable storage medium, which corresponds to a tangible medium such as a data storage medium, or may include any communications medium that facilitates transmission of a computer program from one place to another (for example, according to a communications protocol). In this manner, the computer-readable medium may generally correspond to: (1) a non-transitory tangible computer-readable storage medium, or (2) a communications medium such as a signal or a carrier. The data storage medium may be any usable medium that can be accessed by one or more computers or one or more processors to retrieve instructions, code, and/or data structures for implementing the technologies described in this application. A computer program product may include a computer-readable medium.

An instruction may be executed by one or more processors such as one or more digital signal processors (DSP), a general microprocessor, an application-specific integrated circuit (ASIC), a field programmable gate array (FPGA), or an equivalent integrated circuit or discrete logic circuits. Therefore, the term "processor" used in this specification may refer to the foregoing structure, or any other structure that may be applied to implementation of the technologies described in this specification. In addition, in some aspects, the functions described with reference to the illustrative logical blocks, modules, and steps described in this specification may be provided within dedicated hardware and/or software modules configured for encoding and decoding, or may be incorporated into a combined codec. In addition, the technologies may be completely implemented in one or more circuits or logic elements.

The technologies in this application may be implemented in various apparatuses or devices, including a wireless handset, an integrated circuit (IC), or a set of ICs (for example, a chip set). Various components, modules, or units are described in this disclosure to emphasize functional aspects of devices configured to perform the disclosed techniques, but do not necessarily require realization by different hardware units. Actually, as described above, various units may be combined in an encoder and decoder hardware unit in combination with appropriate software and/or firmware, or may be provided by interoperable hardware units (including one or more processors described above).

The terms used in the following embodiments are merely intended to describe specific embodiments, but are not intended to limit this application. The terms "one", "a" and "this" of singular forms used in this specification and the appended claims of this application are also intended to include expressions such as "one or more", unless otherwise specified in the context clearly. It should be further understood that, in the following embodiments of this application, "at least one" or "one or more" means one, two, or more. The term "and/or" is used to describe an association relationship between associated objects and represents that three relationships may exist. For example, A and/or B may represent the following three cases: Only A exists, both A and B exist, and only B exists, where A and B may be singular or plural. The character "/" generally indicates an "or" relationship between the associated objects.

Reference to "one embodiment" or "some embodiments" described in this specification or the like means that one or more embodiments of this application include a particular feature, structure, or characteristic described in combination with the embodiment. Therefore, statements such as "in an embodiment", "in some embodiments", "in some other embodiments", and "in other embodiments" that appear at different places in this specification do not necessarily mean referring to a same embodiment. Instead, the statements mean "one or more but not all of embodiments", unless otherwise specifically emphasized in another manner. The terms "include", "have", and their variants all mean "include but are not limited to", unless otherwise specifically emphasized in another manner.

The foregoing descriptions are merely example specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A memory, comprising:
S storage blocks;
N global bitlines;
a signal amplification circuit, wherein:
    each of the S storage blocks is connected to the N global bitlines,
    the N global bitlines are connected to the signal amplification circuit,
    the signal amplification circuit is configured to amplify electrical signals on the N global bitlines,
    S and N are positive integers and S≥2,
    each storage block comprises N columns of storage units, N local bitlines, and
    N bitline switches; and
in each storage block:
    storage units in an $i^{th}$ column in the N columns of storage units are connected to an $i^{th}$ local bitline in the N local bitlines,
    an $i^{th}$ bitline switch of the N bitline switches,
the $i^{th}$ local bitline is connected to an $i^{th}$ global bitline in the N global bitlines via the $i^{th}$ bitline switch in the N bitline switches, N is a positive integer, and i is a positive integer not greater than N; and
wherein:
    each storage block is divided into T storage sub-blocks, the storage sub-blocks in the memory are arranged in S rows×T columns, each column of storage sub-blocks forms one storage domain, the memory comprises T storage domains, the memory further comprises W global wordlines, T and W are positive integers, T≥2, and each of the T storage domains comprises W rows of storage units, W local wordlines, and W wordline switches; and
    in each storage domain, storage units in a $v^{th}$ row in the W rows of storage units are connected to a $v^{th}$ local wordline in the W local wordlines, the $v^{th}$ local wordline is connected to a $v^{th}$ global wordline in the W global wordlines by using a $v^{th}$ wordline switch in the W wordline switches, W is a positive integer, and v is a positive integer not greater than W.

2. The memory according to claim 1, wherein the signal amplification circuit comprises N differential amplifiers, and an i$^{th}$ differential amplifier in the N differential amplifiers is configured to amplify an electrical signal on the i$^{th}$ global bitline.

3. The memory according to claim 1, wherein the signal amplification circuit comprises P multiplexers and P differential amplifiers, an input end of a k$^{th}$ multiplexer in the P multiplexers is connected to at least two of the N global bitlines, an output end of the k$^{th}$ multiplexer in the P multiplexers is connected to a k$^{th}$ differential amplifier in the P differential amplifiers, the k$^{th}$ multiplexer in the P multiplexers is configured to select, for outputting, one electrical signal from electrical signals transmitted on the at least two global bitlines, P is a positive integer not greater than N, and k is a positive integer not greater than P.

4. The memory according to claim 1, wherein each storage block further comprises N first control lines separately connected to control inputs of the N bitline switches, the N first control lines are all connected to a first control circuit, and the first control circuit is configured to control the N bitline switches to be turned on or off.

5. The memory according to claim 1, wherein the memory further comprises a bitline drive circuit, and the bitline drive circuit is connected to the N global bitlines, and is configured to input electrical signals to the N global bitlines.

6. The memory according to claim 1, wherein the storage units in each storage block are arranged in M rows×N columns, each storage block further comprises M wordlines, storage units in a j$^{th}$ row in the M rows×N columns of storage units are connected to a j$^{th}$ wordline in the M wordlines, M is a positive integer, and j is a positive integer not greater than M.

7. The memory according to claim 6, wherein the memory further comprises a wordline drive circuit, and the wordline drive circuit is connected to wordlines in the S storage blocks, and is configured to control a potential of the wordline.

8. The memory according to claim 1, wherein each storage domain further comprises W second control lines separately connected to the W wordline switches, the W second control lines are all connected to a second control circuit, and the second control circuit is configured to control the W wordline switches to be turned on or off.

9. The memory according to claim 1, wherein the memory further comprises a wordline drive circuit, and the wordline drive circuit is connected to global wordlines in the T storage domains, and is configured to control a potential of the global wordline.

10. A storage apparatus, comprising:
a memory;
a storage controller coupled to the memory;
the memory comprises:
S storage blocks,
N global bitlines, and
a signal amplification circuit,
each of the S storage blocks is connected to the N global bitlines,
the N global bitlines are connected to the signal amplification circuit,
the signal amplification circuit is configured to amplify electrical signals on the N global bitlines,
S and N are positive integers, and S≥2,
each storage block comprises N columns of storage units,
N local bitlines,
N bitline switches coupled to the N local bitlines and N global bitlines; and in each storage block,
storage units in an i$^{th}$ column in the N columns of storage units are connected to an i$^{th}$ local bitline in the N local bitlines, the i$^{th}$ local bitline is connected to an i$^{th}$ global bitline in the N global bitlines via an i$^{th}$ bitline switch in the N bitline switches, N is a positive integer, and i is a positive integer not greater than N; and
wherein:
each storage block is divided into T storage sub-blocks, the storage sub-blocks in the memory are arranged in S rows×T columns, each column of storage sub-blocks forms one storage domain, the memory comprises T storage domains, the memory further comprises W global wordlines, T and W are positive integers, T≥2, and each of the T storage domains comprises W rows of storage units, W local wordlines, and W wordline switches; and
in each storage domain, storage units in a v$^{th}$ row in the W rows of storage units are connected to a v$^{th}$ local wordline in the W local wordlines, the v$^{th}$ local wordline is connected to a v$^{th}$ global wordline in the W global wordlines by using a v$^{th}$ wordline switch in the W wordline switches, W is a positive integer, and v is a positive integer not greater than W.

11. The memory according to claim 10, wherein the signal amplification circuit comprises N differential amplifiers, and an i$^{th}$ differential amplifier in the N differential amplifiers is configured to amplify an electrical signal on the i$^{th}$ global bitline.

12. The memory according to claim 10, wherein the signal amplification circuit comprises P multiplexers and P differential amplifiers, an input end of a k$^{th}$ multiplexer in the P multiplexers is connected to at least two of the N global bitlines, an output end of the k$^{th}$ multiplexer in the P multiplexers is connected to a k$^{th}$ differential amplifier in the P differential amplifiers, the k$^{th}$ multiplexer in the P multiplexers is configured to select, for outputting, one electrical signal from electrical signals transmitted on the at least two global bitlines, P is a positive integer not greater than N, and k is a positive integer not greater than P.

13. The memory according to claim 10, wherein each storage block further comprises N first control lines separately connected to control inputs of the N bitline switches, the N first control lines are all connected to a first control circuit, and the first control circuit is configured to control the N bitline switches to be turned on or off.

14. The memory according to claim 10, wherein the memory further comprises a bitline drive circuit, and the bitline drive circuit is connected to the N global bitlines, and is configured to input electrical signals to the N global bitlines.

15. A terminal, comprising a processor, a storage controller and a memory, wherein the memory is coupled to the processor, wherein the memory comprises S storage blocks, N global bitlines, and a signal amplification circuit, wherein each of the S storage blocks is connected to the N global bitlines, the N global bitlines are connected to the signal amplification circuit, the signal amplification circuit is configured to amplify electrical signals on the N global bitlines, S and N are positive integers, S≥2, and each storage block comprises N columns of storage units, N local bitlines, and N bitline switches; and
in each storage block, storage units in an i$^{th}$ column in the N columns of storage units are connected to an i$^{th}$ local bitline in the N local bitlines, the i$^{th}$ local bitline is connected to an i$^{th}$ global bitline in the N global bitlines by using an $i^{th}$ bitline switch in the N bitline switches, N is a positive integer, and i is a positive integer not greater than N; and wherein:

each storage block is divided into T storage sub-blocks, the storage sub-blocks in the memory are arranged in S rows×T columns, each column of storage sub-blocks forms one storage domain, the memory comprises T storage domains, the memory further comprises W global wordlines, T and W are positive integers, T≥2, and each of the T storage domains comprises W rows of storage units, W local wordlines, and W wordline switches; and in each storage domain, storage units in a $v^{th}$ row in the W rows of storage units are connected to a $v^{th}$ local wordline in the W local wordlines, the $v^{th}$ local wordline is connected to a $v^{th}$ global wordline in the W global wordlines by using a $v^{th}$ wordline switch in the W wordline switches, W is a positive integer, and v is a positive integer not greater than W.

16. The memory according to claim 15, wherein the signal amplification circuit comprises N differential amplifiers, and an $i^{th}$ differential amplifier in the N differential amplifiers is configured to amplify an electrical signal on the $i^{th}$ global bitline.

17. The memory according to claim 15, wherein the signal amplification circuit comprises P multiplexers and P differential amplifiers, an input end of a $k^{th}$ multiplexer in the P multiplexers is connected to at least two of the N global bitlines, an output end of the $k^{th}$ multiplexer in the P multiplexers is connected to a $k^{th}$ differential amplifier in the P differential amplifiers, the $k^{th}$ multiplexer in the P multiplexers is configured to select, for outputting, one electrical signal from electrical signals transmitted on the at least two global bitlines, P is a positive integer not greater than N, and k is a positive integer not greater than P.

18. The memory according to claim 15, wherein each storage block further comprises N first control lines separately connected to control ends of the N bitline switches, the N first control lines are all connected to a first control circuit, and the first control circuit is configured to control the N bitline switches to be turned on or off.

19. The memory according to claim 15, wherein the memory further comprises a bitline drive circuit, and the bitline drive circuit is connected to the N global bitlines, and is configured to input electrical signals to the N global bitlines.

* * * * *